(12) United States Patent
Lee et al.

(10) Patent No.: US 12,396,323 B2
(45) Date of Patent: Aug. 19, 2025

(54) DISPLAY DEVICE HAVING PROTRUDED STRUCTURE IN BENDING REGION AND METHOD OF PROVIDING THE SAME

(71) Applicant: Samsung Display Co., LTD., Yongin-si (KR)

(72) Inventors: Jeong Seok Lee, Yongin-si (KR); Oh June Kwon, Hwaseong-si (KR); Woo Yong Sung, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 532 days.

(21) Appl. No.: 17/841,778

(22) Filed: Jun. 16, 2022

(65) Prior Publication Data

US 2023/0092412 A1   Mar. 23, 2023

(30) Foreign Application Priority Data

Sep. 23, 2021   (KR) .......................... 10-2021-0125814

(51) Int. Cl.
| | |
|---|---|
| H10K 50/84 | (2023.01) |
| H10K 50/844 | (2023.01) |
| H10K 71/00 | (2023.01) |
| H10K 77/10 | (2023.01) |
| H10K 102/00 | (2023.01) |

(52) U.S. Cl.
CPC .......... *H10K 50/844* (2023.02); *H10K 71/00* (2023.02); *H10K 77/111* (2023.02); *H10K 2102/311* (2023.02)

(58) Field of Classification Search
CPC ..... H10K 50/844; H10K 71/00; H10K 77/111

USPC ......................................................... 257/100
See application file for complete search history.

(56) References Cited

U.S. PATENT DOCUMENTS

| | | | |
|---|---|---|---|
| 10,135,028 B2 | 11/2018 | Kim et al. | |
| 11,417,860 B2 | 8/2022 | Lee et al. | |
| 12,178,071 B2 | 12/2024 | Lee et al. | |
| 2016/0204366 A1 | 7/2016 | Zhang et al. | |
| 2017/0346041 A1 | 11/2017 | Kim et al. | |
| 2020/0144540 A1 | 5/2020 | Lee et al. | |
| 2020/0243781 A1* | 7/2020 | Kim ..................... | H10K 77/111 |

(Continued)

FOREIGN PATENT DOCUMENTS

| | | | | |
|---|---|---|---|---|
| CN | 105679791 A | * | 6/2016 | ............. H01L 27/32 |
| CN | 110112306 A | | 8/2019 | |

(Continued)

OTHER PUBLICATIONS

European Search Report for European Patent Application No. 22197070.0 dated Jan. 30, 2023.

*Primary Examiner* — Phuc T Dang
(74) *Attorney, Agent, or Firm* — CANTOR COLBURN LLP

(57) ABSTRACT

A display device includes a substrate including a display area and a bending region which is adjacent to the display area, a pixel partition wall layer on the substrate, in the display area, and including a pixel-defining layer and a spacer which is on the pixel-defining layer, a first bending protective layer on the substrate, in the bending region, and including a base and a protrusion pattern which is on the base, and a bending inorganic layer on the first bending protective layer. The bending inorganic layer on the protrusion pattern includes an outer surface in an inverted taper shape.

18 Claims, 28 Drawing Sheets

(56) References Cited

U.S. PATENT DOCUMENTS

| | | | |
|---|---|---|---|
| 2021/0066419 A1* | 3/2021 | Byun | H10K 59/8731 |
| 2021/0202902 A1* | 7/2021 | Shim | H10K 59/873 |
| 2021/0264820 A1 | 8/2021 | Wang et al. | |

FOREIGN PATENT DOCUMENTS

| | | | | |
|---|---|---|---|---|
| CN | 112164713 A | | 1/2021 | |
| JP | 2020190728 A | * | 11/2020 | ....... G02F 1/133305 |
| KR | 20170133812 A | | 12/2017 | |
| KR | 1020180060710 A | | 6/2018 | |
| KR | 20200051150 A | | 5/2020 | |
| KR | 1020200059814 A | | 5/2020 | |
| KR | 1020200063590 A | | 6/2020 | |
| KR | 102158771 B1 | * | 9/2020 | |

* cited by examiner

DISPLAY DEVICE HAVING PROTRUDED STRUCTURE IN BENDING REGION AND METHOD OF PROVIDING THE SAME

This application claims priority to Korean Patent Application No. 10-2021-0125814 filed on Sep. 23, 2021, and all the benefits accruing therefrom under 35 U.S.C. § 119, the disclosure of which is incorporated herein by reference in its entirety.

BACKGROUND

1. Field

The disclosure relates to a display device and a method of fabricating (or providing) the same. More particularly, the disclosure relates to a display device including a bending structure and a method of fabricating (or providing) the same.

2. Description of the Related Art

Display devices become more important as multimedia technology evolves. As display devices, a variety of types of display devices such as liquid-crystal display (LCD) devices and organic light-emitting display (OLED) devices are used. Among them, an organic light-emitting display device is able to self-emit light and has a wide viewing angle. Accordingly, an organic light-emitting display device is attracting attention as the next generation display device.

A display device includes a display area and a non-display area. The non-display area may form the bezel of the display device. Techniques for bending the display panel of a display device toward the rear side have been developed in order to reduce the bezel.

SUMMARY

Although a bendable display panel has the advantage that a bezel can be reduced, layers within the display panel may be delaminated due to bending stress.

Aspects of the disclosure provide a display device that can suppress delamination of a bending protective layer in a panel bending region of a display panel.

It should be noted that objects of the disclosure are not limited to the above-mentioned object, and other objects of the disclosure will be apparent to those skilled in the art from the following descriptions.

According to an embodiment of the disclosure, a display device includes a substrate including a display area and a bending region which is adjacent to the display area, a pixel partition wall layer on the substrate, in the display area, and including a pixel-defining layer and a spacer which is on the pixel-defining layer, a first bending protective layer on the substrate, in the bending region, and including a base and a protrusion pattern which is on the base, and a bending inorganic layer on the first bending protective layer. The bending inorganic layer on the protrusion pattern includes an outer surface in an inverted taper shape.

In an embodiment, the base and the protrusion pattern may be integral with each other.

In an embodiment, the pixel-defining layer and the spacer may be integral with each other, and the pixel partition wall layer and the first bending protective layer may include a same material.

In an embodiment, a height of the protrusion pattern may be equal to a height of the spacer.

In an embodiment, the display device may further include a second bending protective layer on the first bending protective layer.

In an embodiment, the bending inorganic layer at an upper portion of the protrusion pattern, may protrude further from the protrusion pattern (e.g., outward), than the bending inorganic layer at a lower portion of the protrusion pattern.

In an embodiment, the display device may further include an opening located where the protrusion pattern is not disposed on the base, the opening has a shadow area between the bending inorganic layer at an upper portion of the protrusion pattern and the base overlapping the bending inorganic layer.

In an embodiment, the shadow area may be filled with the second bending protective layer.

In an embodiment, the display device may further include a thin-film encapsulation layer, the encapsulation layer may be on the pixel-defining layer in the display area and include a first inorganic layer, an organic layer on the first inorganic layer, and a second inorganic layer on the organic layer.

In an embodiment, the bending inorganic layer may include a same material as at least one of the first inorganic layer and the second inorganic layer.

In an embodiment, the protrusion pattern may include a plurality of protrusions each including an outer surface in the inverted taper shape, and the protrusions may be spaced apart from one another.

According to an embodiment of the disclosure, a display device includes a substrate including a display area and a bending region which is adjacent to the display area, a plurality of pixels in the display area, a polarization layer in the display area and covering the plurality of pixels, an anti-delamination protrusion structure in the bending region and having an outer surface in an inverted taper shape, and a bending protective layer on the anti-delamination protrusion structure and in contact with an upper surface and side surfaces of the anti-delamination protrusion structure. The bending protective layer is in partial contact with the polarizing layer.

In an embodiment, the anti-delamination protrusion structure may include an organic protrusion and a bending inorganic layer which is on the organic protrusion.

In an embodiment, side surfaces of the organic protrusion may have a vertical or normal taper inclination with respect to the substrate, and side surfaces of the bending inorganic layer on the side surfaces of the organic protrusion may have an inverted taper inclination to define the inverted taper shape.

According to an embodiment of the present disclosure, a method of fabricating (or providing) a display device includes providing a substrate including a display area and a bending region which is in the display area, forming (or providing) a first bending protective layer including a base in the bending region of the substrate and a protrusion pattern which is on the base, and forming a bending inorganic layer on the first bending protective layer so that an outer surface thereof has an inverted taper shape.

In an embodiment, the forming of the bending inorganic layer may be carried out by chemical vapor deposition.

In an embodiment, the protrusion pattern may include a plurality of protrusions, and a side surface of each of the plurality of protrusions may have a vertical or normal taper inclination with respect to the substrate.

In an embodiment, the method may further include forming a second bending protective layer on the bending inorganic layer.

In an embodiment, the method may further include forming a pixel partition wall layer in the display area of the substrate, the pixel partition wall including a pixel-defining layer and a spacer which is on the pixel-defining layer, the forming of the pixel partition wall and the forming of the first bending protective layer being simultaneous.

In an embodiment, a height of the protrusion pattern may be equal to a height of the spacer.

According to an embodiment of the disclosure, it is possible to suppress the delamination of a bending protective layer by an anti-delamination structure in a panel bending region, and to increase adhesion between the bending protective layer and the anti-delamination structure. In this manner, it is possible to reduce the radius of curvature of the bending protective layer fixing area and the panel bending region, and further reduce the dead space on the lower side of the panel.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION

Figure 1:
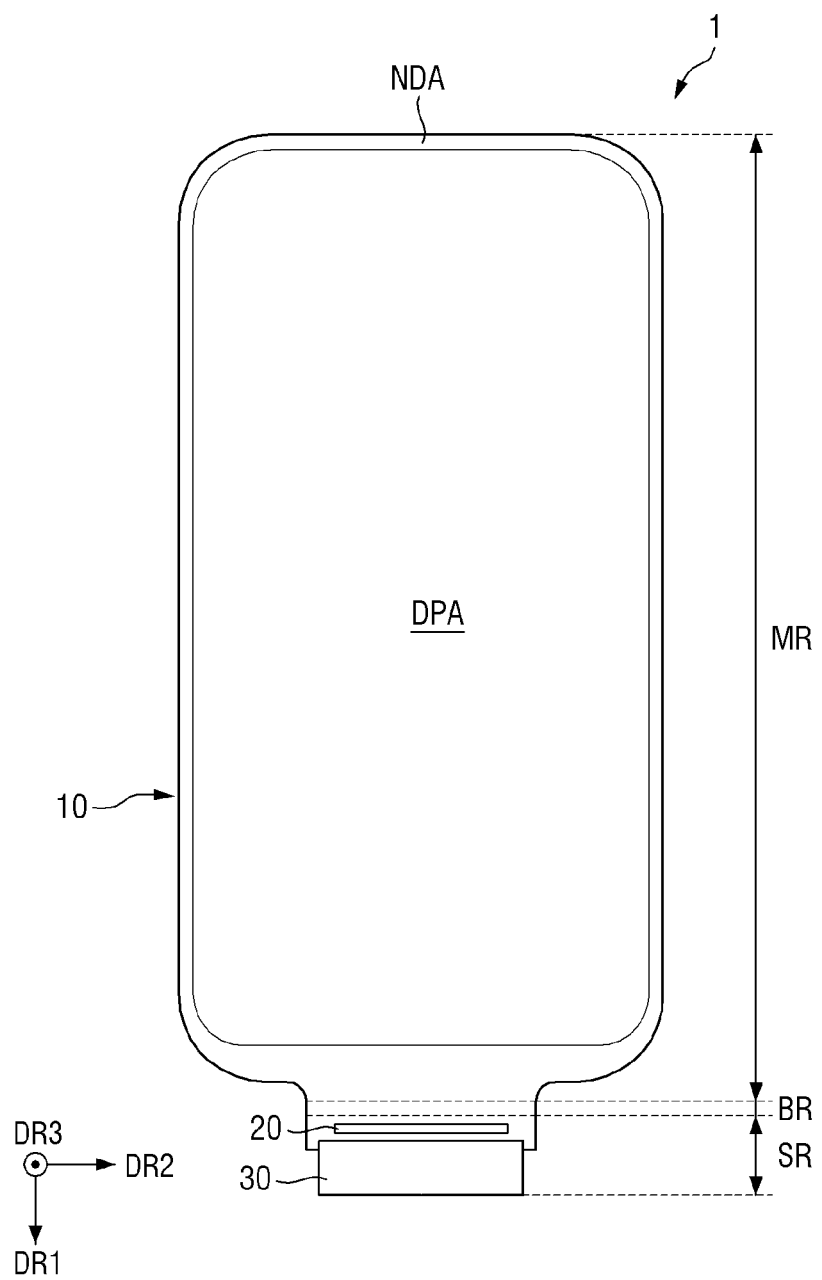
FIG. 1 is a plan view of a display device according to an embodiment of the disclosure.

The invention will now be described more fully hereinafter with reference to the accompanying drawings, in which embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

It will also be understood that when a layer is referred to as being related to another element such as being "on" another layer or substrate, it can be directly on the other layer or substrate, or intervening layers may also be present. In contrast, when a layer is referred to as being related to another element such as being "directly on" another layer or substrate, no other layer or substrate, or intervening layer is present.

The same reference numbers indicate the same or similar components throughout the specification. As used herein, a reference number may indicate a singular element or a plurality of the element. For example, a reference number labeling a singular form of an element within the drawing figures may be used to reference a plurality of the singular element within the text of specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the invention. Similarly, the second element could also be termed the first element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the disclosure will be described in detail with reference to the accompanying drawings.

Figure 2:
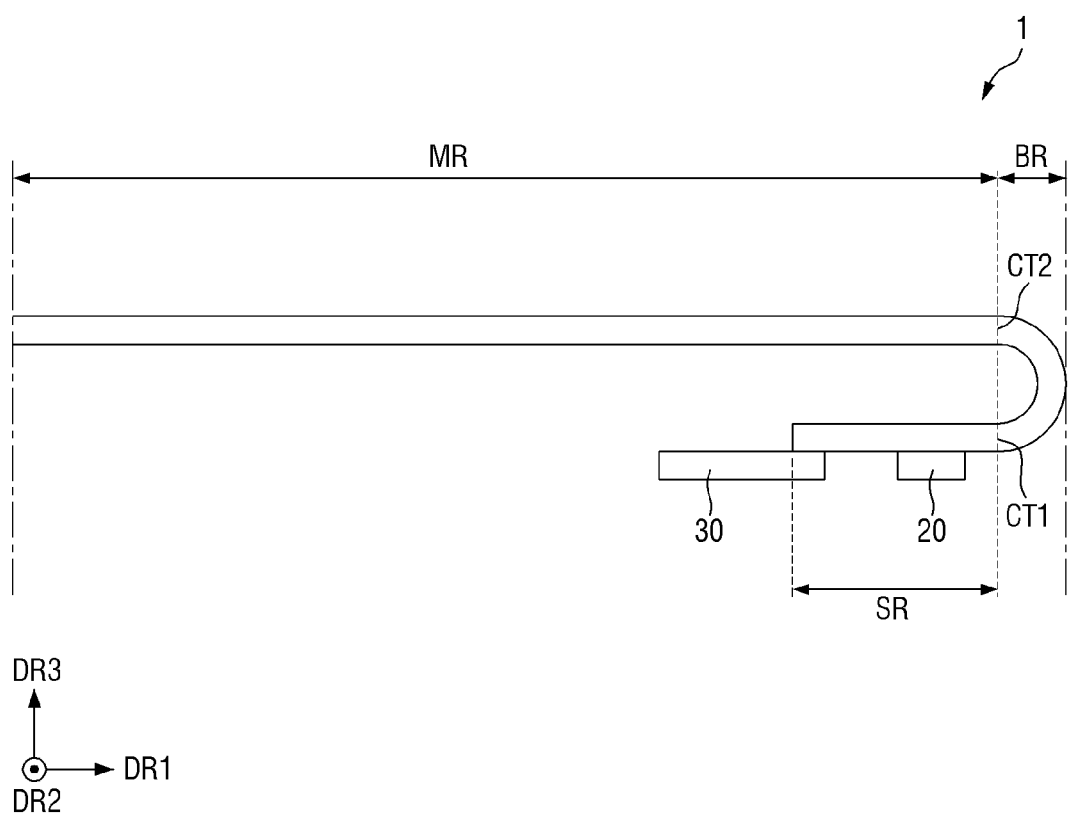
FIG. 2 is a cross-sectional view of a display device according to an embodiment of the disclosure.

FIG. 1 is a plan view of a display device 1 according to an embodiment of the disclosure. FIG. 2 is a cross-sectional view of a display device 1 according to an embodiment of the disclosure.

In the plan view of FIG. 1, up-and-down directions, and right-and-left directions are defined for convenience of illustration. The up-and-down directions refer to vertical or column directions and are defined as first directions DR1. The left-and-right directions refer to horizontal or row directions and are defined as second directions DR2. A vertical direction is defined as a third direction DR3. As used herein, "upper edge," "lower edge," "left edge" and "right edge" of an anti-delamination structure and the like refer to edges or ends located on the upper side, the lower side, the left side and the right side of the anti-delamination structure and the like, respectively. It should be understood that the directions referred with respect to the embodiments are relative directions, and the embodiments are not limited to the directions mentioned above.

Referring to FIGS. 1 and 2, a display device 1 is for displaying moving images or still images. The display device 1 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra-mobile PC (UMPC), as well as the display screen of various products such as a television, a notebook, a monitor, a billboard and the Internet of Things. Examples of the display device 1 may be an organic light-emitting display device, a liquid-crystal display device, a plasma display device, a field emission display device, an electrophoretic display device, an electrowetting display device, a quantum dot light-emitting display device, a micro LED display device and the like. In the following description, an organic light-emitting display device will be described as an example of display devices. It is, however, to be understood that embodiments of the disclosure are not limited thereto.

The display device 1 may include a display panel 10. The display panel 10 may include a flexible substrate including a flexible polymer material such as polyimide. Accordingly, the display panel 10 is curvable, bendable, foldable or rollable and may be curved, bent, folded or rolled.

The display panel 10 may include a main region MR and a bending region BR (otherwise referred to as a panel bending region BR) which is connected to and extended from one side of the main region MR. The display panel 10 may further include a subsidiary region SR connected to and extended from the panel bending region BR. The display panel 10 (or the display device 1) which is bent may dispose the subsidiary region SR overlapped with the main region MR in the thickness direction (e.g., along the third direction DR3).

An area (e.g., planar area) of the display panel 10 in which images are displayed is defined as a display area DPA. An area of the display panel 10 in which no image is displayed is defined as a non-display area NDA. The display area DPA of the display panel 10 is disposed in the main region MR. A portion of the non-display area NDA is also in the main region MR. The area of the display panel 10 other than the display area DPA (e.g., remaining area) serves as the non-display area NDA of the display panel 10. In an embodiment, the edge portion of the main region MR around the display area DPA, the entire panel bending region BR and the entire subsidiary region SR may be a non-display area NDA. It is, however, to be understood that the disclosure is not limited thereto. In an embodiment, the panel bending region BR and/or the subsidiary region SR may also include the display area DPA. Various layers or components of the display device 1 and/or the display panel 10 may include a display area DPA and a non-display area NDA corresponding to those described herein.

The main region MR may have a shape generally similar to the appearance of the display device 1 when viewed from the top. The main region MR may be a flat region located in one plane. Referring to FIGS. 1 and 2, the plane may be defined by the first direction DR1 and the second direction DR2 crossing each other. It is, however, to be understood that the disclosure is not limited thereto. At least one of the edges (e.g., edge portions) of the main region MR except for the edge (side) connected to the panel bending region BR may be bent to form a curved surface or may be bent at a right angle.

The display area DPA of the display panel 10 may be disposed at the center of the main region MR or spaced apart from outer edges of the display panel 10. The display area DPA may include pixels. Each of the pixels may include an emissive layer and a circuit layer for controlling the amount of light emitted from the emissive layer. The circuit layer may include a display line, a display electrode, and at least one transistor. The emissive layer may include an organic light-emitting material. The emissive layer may be encapsulated by an encapsulation layer. The configuration of each of the pixels will be described in detail later.

The display area DPA may have a rectangular shape or a rectangular shape with rounded corners. It is, however, to be understood that the disclosure is not limited thereto. The display area DPA may have various shapes such as a square or other polygonal or circular shape, elliptical shape, etc.

When at least one of the edges of the main region MR except for the edge (side) connected to the panel bending region BR is bent to form a curved surface or is bent at a right angle, the display area DPA may also be disposed at the edge. It is, however, to be understood that the disclosure is not limited thereto. The non-display area NDA that does not display image may be disposed on the curved or bent edge, or the display area DPA and the non-display area NDA may be disposed together at such inclined edge portion.

In the main region MR, the non-display area NDA may be adjacent to the display area DPA, such as being located around the display area DPA. In the main region MR, the non-display area NDA may be extended from the outer boundary of the display area DPA to the edge (e.g., outer edge) of the display panel 10. In the non-display area NDA of the main region MR, signal lines 133 and 134 (see FIG. 3) for applying signals to the display area DPA or driving circuits may be disposed.

The panel bending region BR is connected to the main region MR. In an embodiment, for example, the panel bending region BR may be connected to one end of the main region MR. A width within the display panel 10 may be taken along the second direction DR2. The width of the panel bending region BR may be less than the width (width of a shorter side) of the main region MR. The portions where the main region MR meets the panel bending region BR may be an L-shape owing to the different widths of the regions.

The display panel 10 (or the display device 1) may include a display surface as a surface furthest in the third direction DR3, without being limited thereto. At the panel bending region BR, the display panel 10 may be bent downward in the thickness direction, e.g., in the direction away from the display surface, with a curvature. Although the panel bending region BR may have a constant radius of curvature, the disclosure is not limited thereto. In an embodiment, the panel bending region BR may define a different radii of curvature for difference sections.

The display panel 10 which is flat or unbent includes a surface which is in a single plane and facing one direction. In the display panel 10 which is bent at the panel bending region BR, a facing direction of a portion of the surface of the display panel 10 is reversed. Specifically, a portion of the surface of the display panel 10 which faces upward may be bent such that the portion faces outward at the panel bending region BR (e.g., in a direction away from the display area DPA) and faces downward. As the display panel 10 is bent at the panel bending region BR, the size (e.g., planar area) of the bezel and the radius of curvature R of the display panel 10 can be reduced, and thus the dead space can be reduced within the display apparatus.

However, a force to delaminate a second bending protective layer BPL (see FIG. 3) or the like may be generated due to a bending stress in the panel bending region BR by bending of the display panel 10. As will be described later, in the display device 1 according to the embodiment, at least one anti-delamination structure D in an inverted taper shape (see FIG. 3) is formed (or provided) in the non-display area NDA including the panel bending region BR, so that it is possible to prevent the delamination of the second bending protective layer BPL. The anti-delamination structure D will be described in detail later.

The subsidiary region SR is extended from the panel bending region BR. The subsidiary region SR may be extended in a direction parallel to the main region MR from the end of the bending region BR. The display device 1 which is bent may dispose the subsidiary region SR overlapping the main region MR, in the thickness direction of the display panel 10. The display device 1 (or the display panel 10) which is bent may dispose the subsidiary region SR overlapping the non-display area NDA at the edge of the main region MR, and overlapping the display area DPA of the main region MR.

The width of the subsidiary region SR may be, but is not limited to being, equal to the width of the panel bending region BR.

A driver chip 20 may be disposed on the subsidiary region SR of the display panel 10. The driver chip 20 may include an integrated circuit for driving the display panel 10. In an embodiment, the integrated circuit may be, but is not limited to, a data driving integrated circuit that generates and provides data signals. The driver chip 20 may be mounted on the display panel 10, in the subsidiary region SR. The driver chip 20 may be mounted on the surface of the display panel 10 which extends from the subsidiary region SR to provide the display surface. As the panel bending region BR is bent and a portion of the surface is reversed as described above, the driver chip 20 is mounted on the portion of the surface of the display panel 10 facing downward in the thickness direction, such that the upper surface of the driver chip 20 may face downward.

The driver chip 20 may be attached on the display panel 10 by an anisotropic conductive film or on the display panel 10 by ultrasonic bonding. The width of the driver chip 20 may be less than the width of the display panel 10 in the horizontal direction. The driver chip 20 is disposed at the center of the subsidiary region SR in the horizontal direction, and the left and right edges of the driver chip 20 may be spaced apart from the left and right edges of the subsidiary region SR, respectively.

A pad unit (not shown) of the display panel 10 may be provided at the end of the subsidiary region SR, and a display driving substrate 30 may be connected to the pad unit. The display driving substrate 30 may be a flexible printed circuit board or film.

A plurality of signal lines 133 and 134 (see FIG. 3) may be disposed in the subsidiary region SR, the panel bending region BR and the main region MR. The plurality of signal lines may be extended from the subsidiary region SR to the main region MR, via the panel bending region BR.

Figure 3:
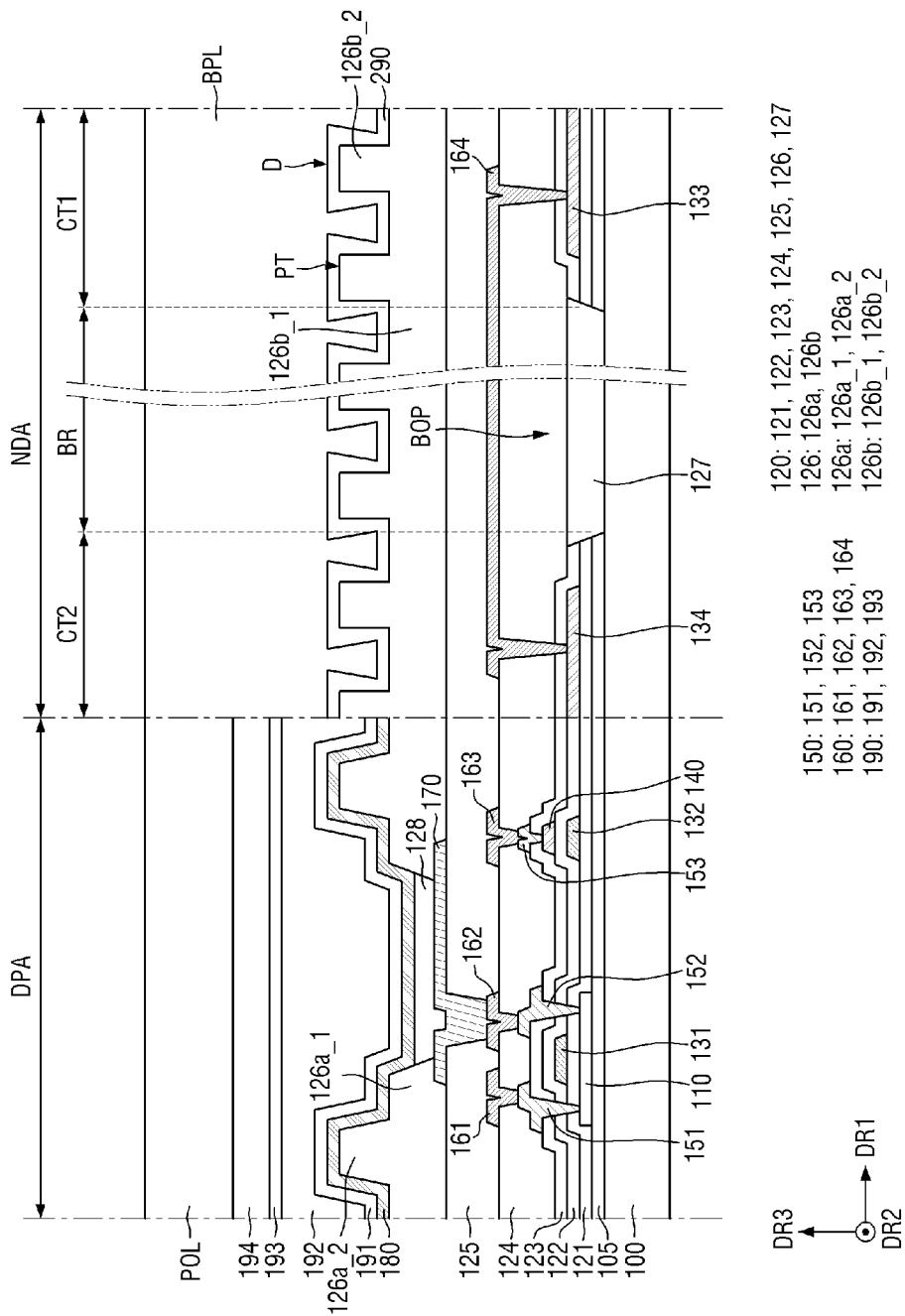
FIG. 3 is a cross-sectional view showing a cross section of a pixel of a display area and a cross section of a non-display area of a display device according to an embodiment of the disclosure.

FIG. 3 is a cross-sectional view showing a cross section of one pixel as well as a cross section of a non-display area NDA of a display device 1 according to an embodiment of the disclosure. In the cross-sectional view of FIG. 3, the display device 1 is not bent (e.g., flat or unbent) and accordingly the non-display area NDA and the display area DPA are in a same plane.

A cross-sectional structure of a pixel and a non-display area NDA of the display device 1 will be described with reference to FIG. 3.

In FIG. 3, the cross-sectional structure of the pixel is depicted on the left side, and a peripheral portion of the panel bending region BR of the non-display area NDA which is closest to the display area DPA, is depicted on the right side. As shown in FIG. 3, contact regions CT1 and CT2 may be located adjacent to the panel bending region BR. Specifically, a first contact region CT1 may be formed at the subsidiary region SR adjacent to the panel bending region BR or at the boundary thereof. A second contact region CT2 may be formed in a portion of the main region MR adjacent to the panel bending region BR or at the boundary thereof (e.g., closest to the panel bending region BR).

The layered structure of an organic light-emitting display device may include the substrate 100, a buffer layer 105, a semiconductor layer 110, a first insulating layer 121, a first conductive layer 130, a second insulating layer 122, a second conductive layer 140, a third insulating layer 123, a bending insulating layer 127, a third conductive layer 150, a fourth insulating layer 124, a fourth conductive layer 160, a fifth insulating layer 125, a fifth conductive layer 170, a sixth insulating layer 126, an emissive layer 128, a sixth conductive layer 180, a thin-film encapsulation layer 190, and a polarization layer POL attached by an adhesive layer 194, as shown in FIG. 3. The first insulating layer 121, the second insulating layer 122, the third insulating layer 123, the fourth insulating layer 124, the fifth insulating layer 125, the sixth insulating layer 126 and the bending insulating layer 127 may together define an insulating structure 120.

Each of the layers described above may be made up of (or include) a single layer, or a stack of multiple layers. Other layers may be further disposed between the layers.

The substrate 100 supports the layers disposed thereon. The substrate 100 may be made of an insulating material such as a polymer resin. Examples of the polymer material may include polyethersulphone (PES), polyacrylate (PA), polyacrylate (PAR), polyetherimide (PEI), polyethylene naphthalate (PEN), polyethylene terephthalate (PET), polyphenylene sulfide (PPS), polyallylate, polyimide (PI), polycarbonate (PC), cellulose triacetate (CAT), cellulose acetate propionate (CAP) or a combination thereof. The substrate 100 may be a flexible substrate that can be bent, folded, or rolled. An example of the material of the flexible substrate may be, but is not limited to, polyimide (PI).

The buffer layer 105 is disposed on the substrate 100. The buffer layer 105 may prevent impurity ions from diffusing, may prevent permeation of moisture or outside air, and may provide a flat surface. The buffer layer 105 may include silicon nitride, silicon oxide, silicon oxynitride, or the like. The buffer layer 105 covers most of the display area DPA and the non-display area NDA of the substrate 100. However, a part of the buffer layer 105 may be removed (or excluded) from the panel bending region BR, to expose the surface of the substrate 100 to outside the buffer layer 105. The buffer layer 105 may be eliminated depending on the type of the substrate 100, process conditions, etc.

The semiconductor layer 110 is disposed on the buffer layer 105. The semiconductor layer 110 forms a channel of a thin-film transistor of the pixel. The semiconductor layer 110 may include polycrystalline silicon. It is, however, to be understood that the disclosure is not limited thereto. The semiconductor layer 110 may include monocrystalline silicon, amorphous silicon, or an oxide semiconductor. The oxide semiconductor may include, for example, a binary compound (ABx), a ternary compound (ABxCy) and a quaternary compound (ABxCyDz) containing indium, zinc, gallium, tin, titanium, aluminum, hafnium (Hf), zirconium (Zr), magnesium (Mg), etc.

The first insulating layer 121 is disposed on the semiconductor layer 110 and may be generally disposed over the entire surface of the substrate 100. However, the first insulating layer 121 may be removed from a part of the panel bending region BR to expose the surface of the substrate 100 to outside the first insulating layer 121.

The first insulating layer 121 may be a gate insulating layer having a gate insulating function. The first insulating layer 121 may include a silicon compound, a metal oxide, etc. In an embodiment, for example, the first insulating layer 121 may include silicon oxide, silicon nitride, silicon oxynitride, aluminum oxide, tantalum oxide, hafnium oxide, zirconium oxide, titanium oxide, etc. They may be used alone or in combinations. The first insulating layer 121 may be made up of a single layer or multiple layers of different materials stacked on one another.

The first conductive layer 130 is disposed on the first insulating layer 121. The first conductive layer 130 may be a first gate conductive layer. The first conductive layer 130 may include a gate electrode 131 of the thin-film transistor of the pixel and a scan line connected thereto, a storage capacitor and a first electrode 132.

The first conductive layer 130 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer 130 may be made up of a single layer or multiple layers.

A second insulating layer 122 may be disposed on the first conductive layer 130. The second insulating layer 122 may be an interlayer dielectric layer. The second insulating layer 122 may include an inorganic insulating material such as silicon oxide, silicon nitride, silicon oxynitride, hafnium oxide, aluminum oxide, titanium oxide, tantalum oxide and zinc oxide.

The second conductive layer 140 is disposed on the second insulating layer 122. The second conductive layer 140 may be a second gate conductive layer. The second conductive layer 140 may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer 140 may be made of, but is not limited to, the same material as the first conductive layer 130. The second conductive layer 140 may be made up of a single layer or multiple layers.

The first conductive layer 130 and/or the second conductive layer 140 may include a first signal line 133 and/or a second signal line 134, which form bending signal lines. The first signal line 133 is disposed in the subsidiary region SR located on one side of the panel bending region BR. The second signal line 134 is extended from the opposite side of the panel bending region BR, in a direction away from the subsidiary region SR, and toward the main region MR. Although the first signal line 133 disposed in the subsidiary region SR around the panel bending region BR and the second signal line 134 disposed in the main region MR are formed of a same layer (e.g., the first conductive layer 130) in the example shown in the drawings, both of the first signal line 133 and the second signal line 134 may be formed of a same layer as the second conductive layers 140, or one of the signal lines may be formed of the first conductive layer 130 while the other may be formed of the second conductive layer 140. As being formed of a same layer, elements may be in a same layer as each other as respective portions of a same material layer, may be on a same layer by forming an interface with a same underlying or overlying layer, may be formed in a same process etc., without being limited thereto.

A third insulating layer 123 is disposed on the second conductive layer 140. The third insulating layer 123 may be an interlayer dielectric layer. The third insulating layer 123 may be generally disposed over the entire surface of the substrate 100. However, the third insulating layer 123 may be removed from a part of the panel bending region BR to expose the surface of the substrate 100.

The third insulating layer 123 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin and benzocyclobutene (BCB). The third insulating layer 123 may be made up of a single layer or multiple layers of different materials stacked on one another.

A bending opening BOP may be defined in the panel bending region BR, and a bending insulating layer 127 may be disposed in the bending opening BOP.

As described above, portions of the buffer layer 105, the first insulating layer 121, the second insulating layer 122 and the third insulating layer 123 may be removed or removed from the panel bending region BR, to expose the upper surface of the substrate 100 to outside these respective layers. As such, the exposed region of the substrate 100 at the panel bending region BR from which a plurality of insulating layers is removed, may be defined as the bending opening BOP. Opposing sidewalls which define the bending opening BOP may be defined by the side surfaces of the buffer layer 105, the first insulating layer 121, the second insulating layer 122 and the third insulating layer 123 stacked on one another. The various side surfaces of the layers defining the bending opening BOP may be aligned with one another.

The bending opening BOP may be filled with the bending insulating layer 127. The lower surface of the bending insulating layer 127 which is closest to the substrate 100 may be in direct contact with the surface of the substrate 100 which is exposed via the bending opening BOP. The sidewalls of the buffer layer 105, the first insulating layer 121, the second insulating layer 122 and the third insulating layer 123 forming the bending opening BOP may be exposed to outside these layers by the bending opening BOP. Although FIG. 3 shows that the upper surface of the bending insulating layer 127 which is furthest from the substrate 100, is located at the same level as the upper surface of the third insulating layer 123 (e.g., coplanar), the disclosure is not limited thereto.

The bending insulating layer 127 may be a via layer including an organic material. The bending insulating layer 127 may include an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene (BCB).

The third conductive layer 150 is disposed on the third insulating layer 123. The third conductive layer 150 may be a first source/drain conductive layer. The third conductive layer 150 may include a first electrode 151 and a second electrode 152 of the thin-film transistor of the pixel, and a first supply voltage electrode 153. The first electrode 151 and the second electrode 152 of the thin-film transistor may be electrically connected to the source region and the drain region of the semiconductor layer 110, respectively, through contact holes passing through the third insulating layer 123, the second insulating layer 122 and the first insulating layer 121.

The third conductive layer 150 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The third conductive layer 150 may be made up of a single layer or multiple layers. For example, the third conductive layer 150 may have a stacked structure of Ti/Al/Ti, Mo/Al/Mo, Mo/AlGe/Mo, and Ti/Cu.

The fourth insulating layer 124 is disposed on the third conductive layer 150. The fourth insulating layer 124 covers the third conductive layer 150. The fourth insulating layer 124 may be a via layer. The fourth insulating layer 124 may include the same material as the above-described bending insulating layer 127 or may include one or more materials selected from the materials listed above as the materials of the bending insulating layer 127.

The fourth insulating layer 124 may cover the third conductive layer 150, the third conductive layer 150 and the bending insulating layer 127, and may be disposed on an entirety of them. That is to say, the fourth insulating layer 124 may be disposed not only in the display area DPA but also in the panel bending region BR and a periphery thereof (e.g., peripheral portion of the non-display area NDA which is closest to the display area DPA). The upper surface of the fourth insulating layer 124 may have the same level in the display area DPA and the panel bending region BR (e.g., upper surfaces coplanar with each other), but the disclosure is not limited thereto.

The fourth conductive layer 160 is disposed on the fourth insulating layer 124. The fourth conductive layer 160 may be a second source/drain conductive layer. The fourth conductive layer 160 may include a data line 161, a connection electrode 162, and a first supply voltage line 163 of the pixel. In the pixel, the data line 161 may be electrically connected to the first electrode 151 of the thin-film transistor of the pixel through a contact hole penetrating through the fourth insulating layer 124. The connection electrode 162 may be electrically connected to the second electrode 152 of the thin-film transistor of the pixel through the contact hole passing through the fourth insulating layer 124. The first supply voltage line 163 may be electrically connected to the first supply voltage electrode 153 through a contact hole passing through the fourth insulating layer 124.

The fourth conductive layer 160 may further include a connection line layer 164 traversing the panel bending region BR. The connection line layer 164 may be electrically connected to the first signal line 133 and the second signal line 134, through at least one contact hole penetrating the fourth insulating layer 124.

The fourth conductive layer 160 may include at least one metal selected from the group consisting of aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The fourth conductive layer 160 may be made up of a single layer or multiple layers. The fourth conductive layer 160 may be made of, but is not limited to, the same material as the third conductive layer 150.

The fourth conductive layer 160 forming the connection line layer 164 may include aluminum, which is a material having a flexible characteristic. In an embodiment, for example, the third conductive layer 150 and the fourth conductive layer 160 may include a stack of layers of Ti/Al/Ti.

Although the fourth conductive layer 160 is used as the connection line layer 164 in the embodiment, the disclosure is not limited thereto. The third conductive layer 150 may be used as the connection line layer 164, or the third conductive layer 150 as well as the fourth conductive layer 160 may be used together as a connection layer.

The fifth insulating layer 125 is disposed on the fourth conductive layer 160. The fifth insulating layer 125 may cover all of the fourth conductive layer 160 and the connection line layer 164, and may be disposed on the entire surface thereof. That is to say, the fifth insulating layer 125 may be disposed not only on the display area DPA but also on the panel bending region BR and its periphery. The upper surface of the fifth insulating layer 125 may have the same level in the display area DPA and the panel bending region BR in the display panel 10 which is not bent, but the disclosure is not limited thereto. The fifth insulating layer 125 may be a via layer. The fifth insulating layer 125 may include the same material as the above-described bending insulating layer 127 or may include one or more materials selected from the materials listed above as the materials of the bending insulating layer 127.

The fifth conductive layer 170 is disposed on the fifth insulating layer 125 in the display area DPA. The anode electrode of the pixel may be formed of the fifth conductive layer 170. The anode electrode may be electrically connected to the connection electrode 162 formed of the fourth conductive layer 160, through the contact hole formed in the fifth insulating layer 125, and may be connected to the second electrode 152 of the thin-film transistor therethrough.

The fifth conductive layer 170 may have a stacked structure of a material layer having a high work function such as indium-tin-oxide (ITO), indium-zinc-oxide (IZO), zinc oxide (ZnO) and indium oxide ($In_2O_3$), and a reflective material layer such as silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca) or a combination thereof. A layer having a higher work function may be disposed on a reflective material layer so that the higher work function layer is disposed closer to the emissive layer 128. The fifth conductive layer 170 may have, but is not limited to, a multilayer structure of ITO/Mg, ITO/MgF, ITO/Ag, and ITO/Ag/ITO.

A sixth insulating layer 126 may be disposed on the fifth conductive layer 170. The sixth insulating layer 126 includes a pixel partition wall layer in the display area DPA and the non-display area NDA. The pixel partition wall layer includes a pixel partition wall 126a disposed in the display area DPA, and a first bending protective layer 126b disposed in the non-display area NDA.

The pixel partition wall 126a located in the display area DPA may include a pixel-defining layer 126a_1 including (or defining) an opening exposing the fifth conductive layer 170 forming the anode electrode to outside the sixth insulating layer, and a plurality of spacers 126a_2 which are disposed on the pixel-defining layer 126a_1 and protruding in the third direction DR3 (e.g., in a direction away from the substrate 100). The spacer 126a_2 may be disposed corresponding to the pixel-defining layer 126a_1 and may have a width smaller than that of the pixel-defining layer 126a_1 in a direction along the substrate 100.

The first bending protective layer 126b located in the non-display area NDA includes a base 126b_1 and a protrusion pattern 126b_2 which is disposed on the base 126b_1 and protruding in the third direction DR3 from the 126b_1. The base 126b_1 covers at least the entire panel bending region BR. The base 126b_1 may have a constant thickness across different regions, but the disclosure is not limited thereto.

The protrusion pattern 126b_2 may include one or more protrusions PT. Each of the protrusions PT in a plurality of protrusions PT may have a rectangular cross-sectional structure. That is to say, as shown in the drawings, the side surfaces of the protrusions PT may be disposed on the plane perpendicular to the substrate 100. It should be understood, however, that the disclosure is not limited thereto. In the cross-sectional view, the sidewalls of the protrusions PT in the third direction DR3 may include inverted taper inclined surfaces, normal taper inclined surfaces (e.g., in a direction normal to the substrate 100) or curved inclined portions. In an embodiment, for example, an organic protrusion (e.g., the protrusion PT) includes side surfaces extended normal with respect to the substrate 100 or extended inclined with respect to the substrate 100, and the bending inorganic layer 290 extends along the side surfaces of the organic protrusion to have an inverted taper inclination.

The protrusions PT are spaced apart from one another along the base 126b_1. The base 126b_1 may include regions where the protrusions PT are disposed and regions where the protrusions PT are not disposed. These regions may be arranged alternately. Accordingly, the first bending protective layer 126b may have depression/elevations on the surface depending on whether the protrusions 126b_2 are disposed or not.

The base 126b_1 of the first bending protective layer 126b may have the same height (or thickness along the third direction DR3) as the pixel-defining layer 126a_1 of the pixel partition wall 126a. The protrusion pattern 126b_2 may have the same height as the spacer 126a_2 of the pixel partition wall 126a. It should be understood, however, that the disclosure is not limited thereto. The pixel-defining layer 126a_1 and the base 126b_1 may together form a base layer from which the spacers 126a_2 and the protrusion pattern 126b_2 protrude.

According to this embodiment, the pixel-defining layer 126a_1 and the spacer 126a_2 are integrally formed of the same material, and the base 126b_1 and the protrusion pattern 126b_2 are integrally formed. It should be understood, however, that the disclosure is not limited thereto. In an embodiment, for example, the pixel-defining layer 126a_1 and the base 126b_1 may be made of a first insulating material, and the spacer 126a_2 and the protrusion pattern 126b_2 may be made of a second insulating material, such as to form a stacked structure.

The sixth insulating layer 126 may include an inorganic insulating material such as silicon oxide, silicon nitride, silicon oxynitride, hafnium oxide, aluminum oxide, titanium oxide, tantalum oxide and zinc oxide, or an organic insulating material such as polyacrylates resin, epoxy resin, phenolic resin, polyamides resin, polyimides resin, unsaturated polyesters resin, poly phenylenethers resin, polyphenylenesulfides resin and benzocyclobutene (BCB). In the following description, an example is illustrated where the sixth insulating layer 126 includes an organic insulating material.

The emissive layer 128 is disposed in the opening of the pixel-defining layer 126a_1 as solid portions of the pixel partition wall 126a. The emissive layer 128 may include an organic emissive layer made of an organic semiconductor material, etc., or an inorganic emissive layer made of an inorganic semiconductor material. When the emissive layer 128 includes an organic semiconductor material, the emissive layer 128 may include an organic emissive layer, a hole injection/transport layer, and an electron injection/transport layer.

The sixth conductive layer 180 is disposed on the emissive layer 128. The sixth conductive layer 180 may be disposed on the emissive layer 128 of the display area DPA, the pixel-defining layer 126a_1 and the spacer 126a_2, but may not be disposed in the non-display area NDA. The cathode electrode may be implemented as the sixth conductive layer 180. The cathode electrode CAT may be disposed over throughout the display area DPA. The sixth conductive layer 180 may include a material having a small work function such as Li, Ca, LiF/Ca, LiF/Al, Al, Mg, Ag, Pt, Pd, Ni, Au, Nd, Ir, Cr, BaF, Ba, or a compound or combination thereof. The sixth conductive layer 180 may further include a transparent metal oxide layer disposed on the material layer having a small work function.

The thin-film encapsulation layer 190 including a first inorganic layer 191, an organic layer 192 and a second inorganic layer 193 is disposed on the sixth conductive layer 180 in the display area DPA. The organic layer 192 can be encapsulated by the first inorganic layer 191 and the second inorganic layer 193.

The first inorganic layer 191 and the second inorganic layer 193 may include one or more materials selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, silicon oxynitride (SiON), etc.

The organic layer 192 may include an organic insulating material such as polyacrylate resin, epoxy resin, phenolic resin, polyamide resin, polyimide resin, unsaturated polyesters resin, polyphenylene ether resin, polyphenylene sulfide resin, and benzocyclobutene (BCB).

A bending inorganic layer 290 may be disposed on the protrusion pattern 126b_2 in the non-display area NDA. According to an embodiment of the disclosure, the bending inorganic layer 290 may be formed via the same material and the same process as the first inorganic layer 191. As another example, the bending inorganic layer 290 may be formed in the same layer and via the same process as the second inorganic layer 193. As another example, the bending inorganic layer 290 may be formed as a stack of the first inorganic layer 191 and the second inorganic layer 193. It should be understood, however, that the embodiments of the disclosure are not limited thereto. The bending inorganic layer 290 may be made of a different material and via a different process from the first inorganic layer 191 and the second inorganic layer 193.

The bending inorganic layer 290 together with the protrusions PT thereunder forms an anti-delamination structure D having an inverted taper shape in cross-section. The anti-delamination structure D will be described in detail later.

A polarization layer POL is disposed on the thin-film encapsulation layer 190 and may have a polarization axis. The polarization layer POL may be attached to the thin-film encapsulation layer 190 by the adhesive layer 194 in the display area DPA. Light is emitted from the emissive layer 128, and the polarization layer POL may transmit only light that vibrates in the same direction as the polarization axis, while absorbing or reflecting light that vibrates in other directions.

The second bending protective layer BPL may be applied on the anti-delamination structure D of the non-display area NDA and may cover the non-display area NDA including the panel bending region BR.

The second bending protective layer BPL may include an ultraviolet-curable (UV-curable) resin, a thermosetting resin, or an electron-beam-curable resin. The second bending protective layer BPL may include acrylic or silicone-based resin, and may further include fine particles of polymer series such as rubber containing silica, epoxy, and an epoxy hybrid. It should be understood, however, that the disclosure is not limited thereto. The second bending protective layer BPL may be formed by attaching a layer such as polyethylene ether phthalate (PET) in a single structure or stacked structure.

As used herein, a height may be taken from a reference, such as an upper surface of the substrate 100. The height of the upper surface of the second bending protective layer BPL may be substantially equal to the height of the upper surface of the polarization layer POL, but the embodiments of the disclosure are not limited thereto. The arrangement relationships between the polarization layer POL and the second bending protective layer BPL will be described with reference to FIGS. 4 to 6.

Figure 4:
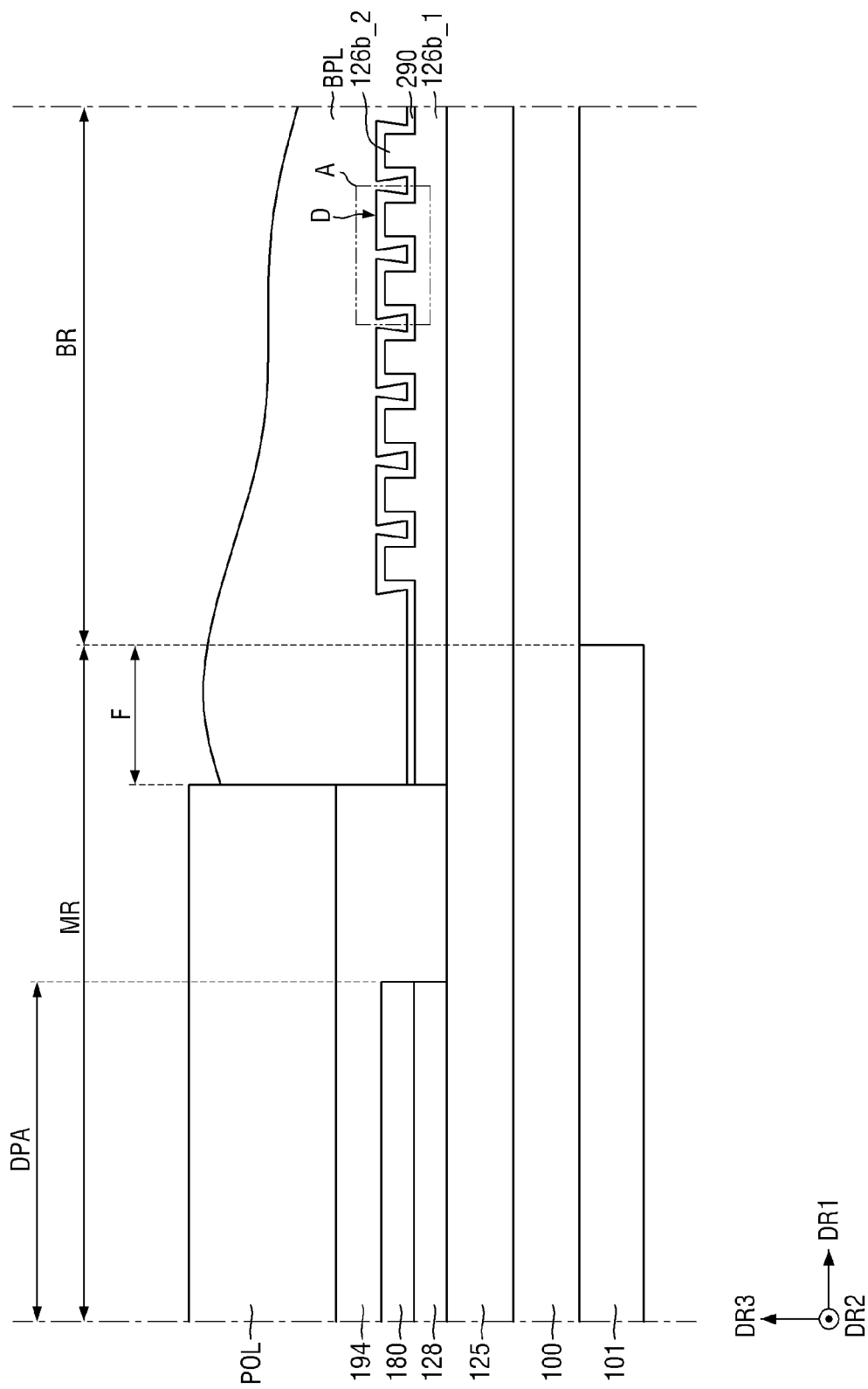
FIGS. 4 to 6 show cross-sectional views of a display area and a non-display area of a display device according to embodiments of the disclosure.
Figure 5:
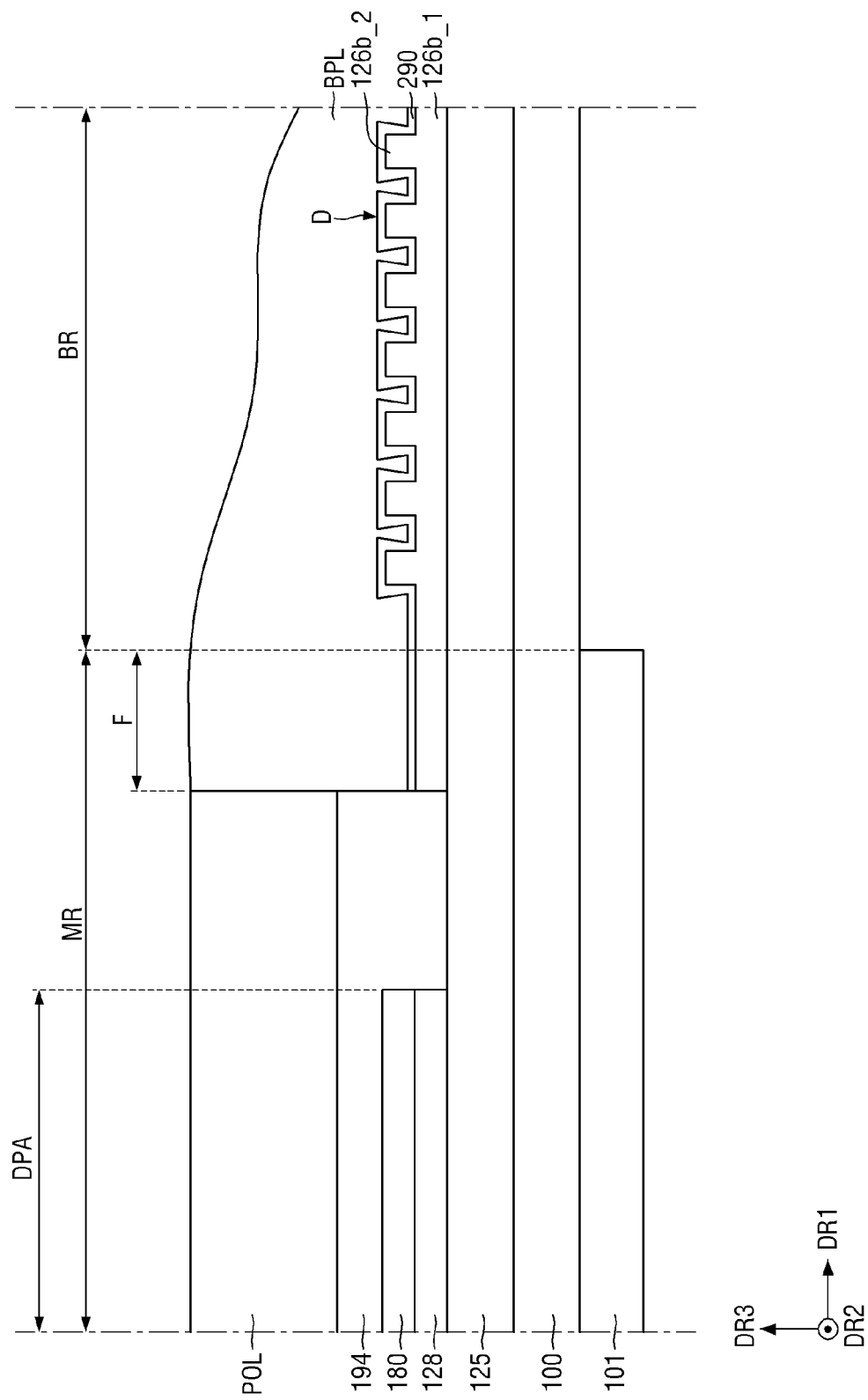
Figure 6:
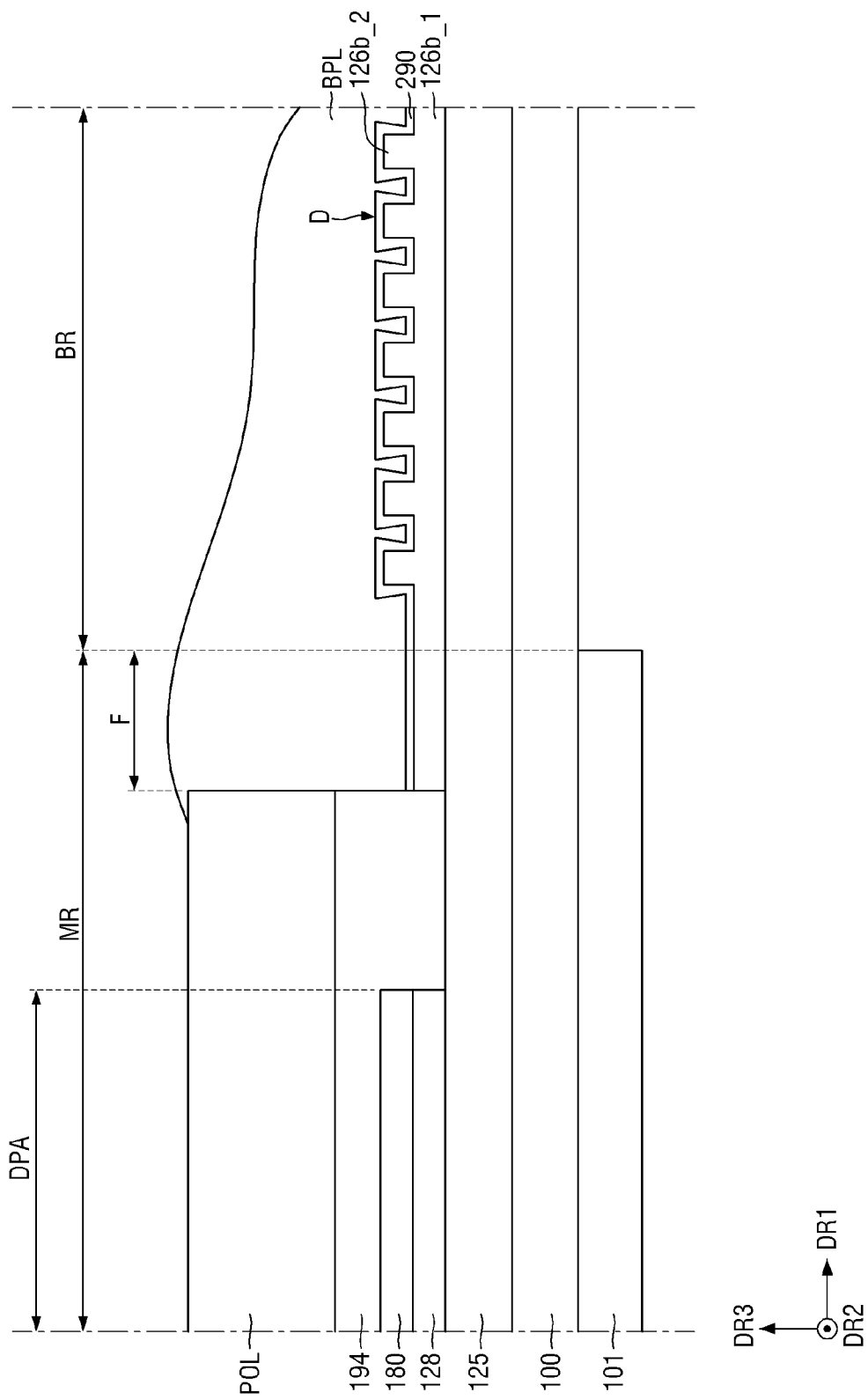

FIGS. 4 to 6 show cross-sectional views of a display area DPA and a non-display area NDA of a display device 1 according to various embodiments of the disclosure.

In order to describe in detail the relationship between the polarization layer POL disposed in the display area DPA and the second bending protective layer BPL disposed in the non-display area NDA, FIGS. 4 to 6 briefly depict a plurality of insulating layers disposed on the entirely surface of the display area DPA and the non-display area NDA, and depict an example where a support member 101 is further disposed under the substrate 100. The support member 101 can support the substrate 100 and can impart rigidity to the substrate 100. The support member 101 may not be disposed in the panel bending region BR so that it does not hinder bending of the substrate 100. The support member 101 may include, for example, polyethylene terephthalate (PET).

As shown in FIGS. 4 to 6, the second bending protective layer BPL may be at least partially in contact with the polarization layer POL.

In embodiments, the second bending protective layer BPL may be in contact with a side surface which is closest to the panel bending region BR (e.g., the side surface extended in the third direction DR3) of the polarization layer POL. The second bending protective layer BPL may be in contact with a lower portion of one side surface of the polarization layer POL while exposing a part of the upper portion further from the substrate 100 than the lower portion as shown in FIG. 4, or may be in contact with an entirety of the side surface of the polarization layer POL as shown in FIG. 5. Furthermore, as shown in FIG. 6, the second bending protective layer BPL not only may cover the side surface of the polarization layer POL, but also may be extended from the side surface to the upper surface of the polarization layer POL, to cover a part of upper surface of the polarization layer POL which is furthest from the substrate 100.

As such, the portion where the second bending protective layer BPL meets the polarization layer POL (e.g., an interface therebetween) and the periphery of the non-display area NDA, may be located in the main region MR, and may be generally located between the panel bending region BR and the display area DPA. Accordingly, the portion where the second bending protective layer BPL meets the polarization layer POL, and the periphery, are not bent in the display device 1 which is bent, and thus the anti-delamination structure D may be excluded from such unbent portion. In the following description, the area of the second bending protective layer BPL extended from the panel bending region BR toward the display area DPA is referred to as a fixing area F of the second bending protective layer BPL.

Hereinafter, the anti-delamination structure D in the inverse taper shape will be described in detail.

Figure 7:
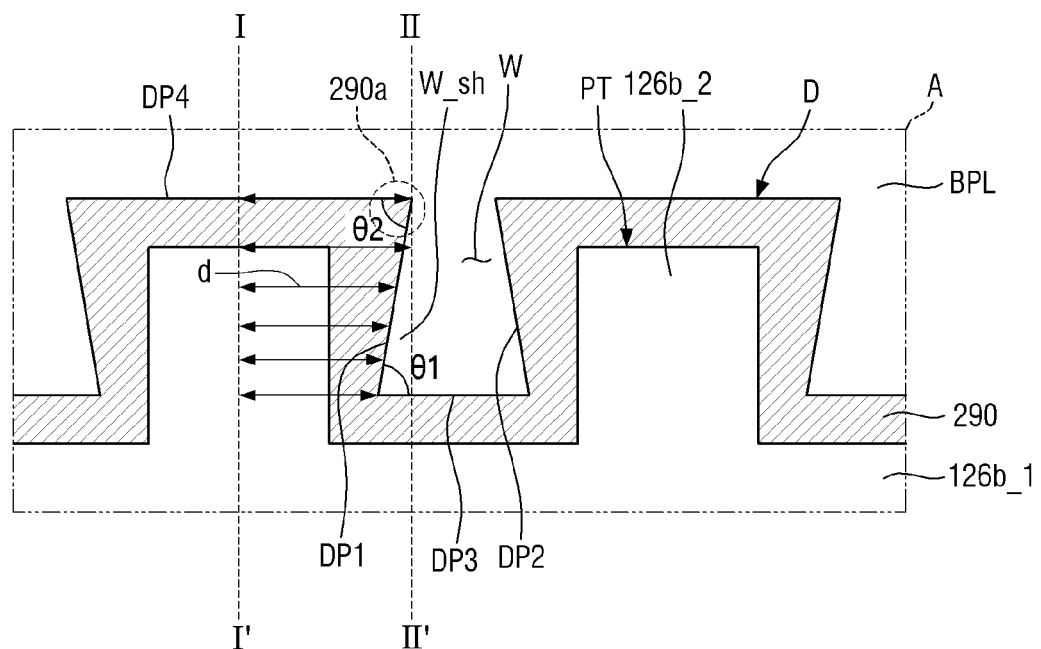
FIG. 7 is an enlarged view of portion A of FIG. 4.

FIG. 7 is an enlarged cross-sectional view of portion A of FIG. 4.

Referring to FIGS. 3 and 7, the bending inorganic layer 290 together with the protrusions PT thereunder, form the anti-delamination structures D. In other words, the anti-delamination structures D include the protrusions PT and the bending inorganic layer 290 which is disposed on the protrusions PT, to provide an anti-delamination protrusion structure. The upper surface structure of the anti-delamination structures D is defined by the upper surface structure of the bending inorganic layer 290.

The bending inorganic layer 290 is disposed on the first bending protective layer 126b. Specifically, the bending inorganic layer 290 is disposed on the upper surface of the protrusions PT, opposing side surfaces of the protrusions PT, and the upper surface of the base 126b_1. According to this embodiment, an outer inclined surface DP1 of the bending inorganic layer 290 disposed on the protrusions PT has a straight shape, but the disclosure is not limited thereto. The outer inclined surface DP1 may include a partially curved surface.

As shown in FIG. 7, the distance from the axis (indicated by line I-I') extended in the vertical direction through the anti-delamination structure D, to the outer inclined surface DP1 of the bending inorganic layer 290 disposed on the protrusion PT, becomes narrower from the upper portion to the lower portion of the anti-delamination D. That is, the distance decreases in a direction from the second bending protective layer BPL toward the first bending protective layer 126. The outer inclined surface DP1 of the bending inorganic layer 290 disposed on the protrusion PT has an inverted taper shape. Accordingly, a first angle θ1 formed by the outer inclined surface DP1 of the bending inorganic layer 290 disposed on the protrusions PT, and an upper base surface DP3 of the bending inorganic layer 290 disposed on the upper surface of the base 126b_1 which is between protrusions PT, may be an acute angle. In addition, a second angle θ2, which is the internal angle of a protruding portion 290a formed at a corner where an upper protrusion surface DP4 of the bending inorganic layer 290 and the outer inclined surface DP1 meet, may also be an acute angle. Since the anti-delamination structure D has a substantially vertically symmetrical shape and a width defined by a width of the bending inorganic layer 290, the anti-delamination structure D may form an inverted taper shape in which the width of the upper portion of the anti-delamination structure D is greater than the width of the lower portion thereof, in the horizontal direction of FIG. 7.

Referring to FIG. 7, adjacent anti-delamination structures D may define an opening W, as a recess, therebetween. The opening W may be located at a position where the protrusion PT is not disposed, and may be defined by the outer inclined surface DP1 of the bending inorganic layer 290 disposed on the protrusion PT, the inclined surface DP2 facing the outer inclined surface DP1, and the upper base surface DP3 of the bending inorganic layer 290 disposed on the upper surface of the base 126b_1. The width of the opening W becomes narrower (e.g., decreases) toward the upper side of the anti-delamination structure D.

According to an embodiment of the disclosure, the second bending protective layer BPL may also be disposed in the opening W formed by the anti-delamination structures D adjacent to each other. As shown in FIG. 7, the opening W includes a shadow area W_sh covered by the anti-delamination structure D at the lower portion of the anti-delamination structure D. The shadow area W_sh may be defined by an imaginary line II-II' drawn from a protruding portion 290a at the upper portion of the anti-delamination structure D, to the base 126b_1 of the first bending protective layer 126b, the outer inclined surface DP1 of the bending inorganic layer 290 disposed on the protrusion PT and a portion of the upper base surface DP3 of the bending inorganic layer 290 disposed on the upper surface of the base 126b_1. The second bending protective layer BPL may be used to fill the entire opening W including the shadow area W_sh. It is possible to suppress the delamination of the part of the second bending protective layer BPL located in the shadow area W_sh by the anti-delamination structure D covering the part of the second bending protective layer BPL. The principle that the shadow area W_sh defined by the anti-delamination structure D contributes to the suppression of delamination of the second bending protective layer BPL will be described with reference to FIGS. 8 and 9.

Figure 8:
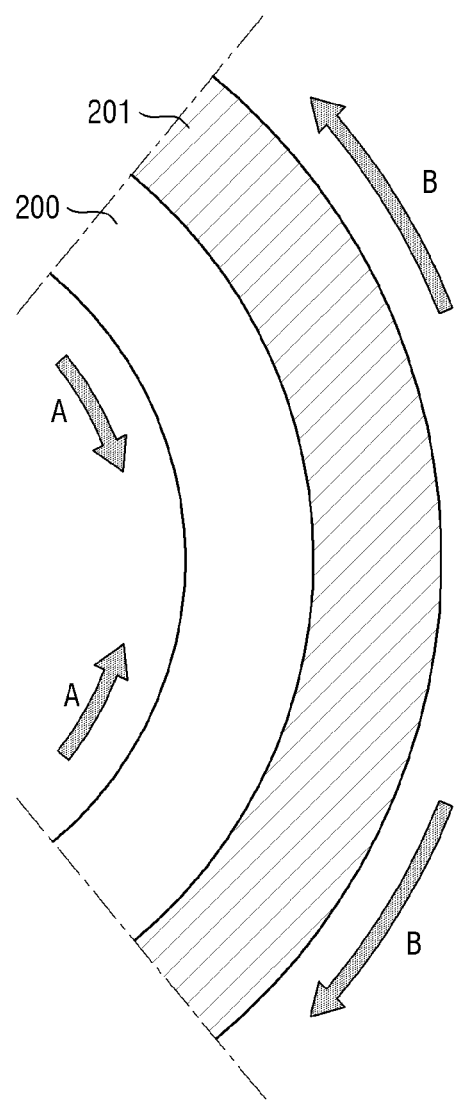
FIG. 8 is a view for illustrating a stress applied to a panel bending region in the display panel which is bent.

FIG. 8 is a view for illustrating a stress applied to a panel bending region BR when the display panel 10 is bent.

FIG. 8 is a view for illustrating a bending stress applied to a second layer 201 when first and second layers 200 and 201 contiguous to each other are bent with a radius of curvature R. When the second layer 201 is disposed on the first layer 200, a tensile bending stress B is applied to the second layer 201, while a compressive bending stress A is applied to the first layer 200.

As such, when bending stresses in different directions are applied, cracks may occur in the first layer 200 and the second layer 201, or the first layer 200 may be delaminated from the second layer 201. The layers 200 and 201 may be delaminated in the thickness direction perpendicular to an interface therebetween.

Figure 9A:
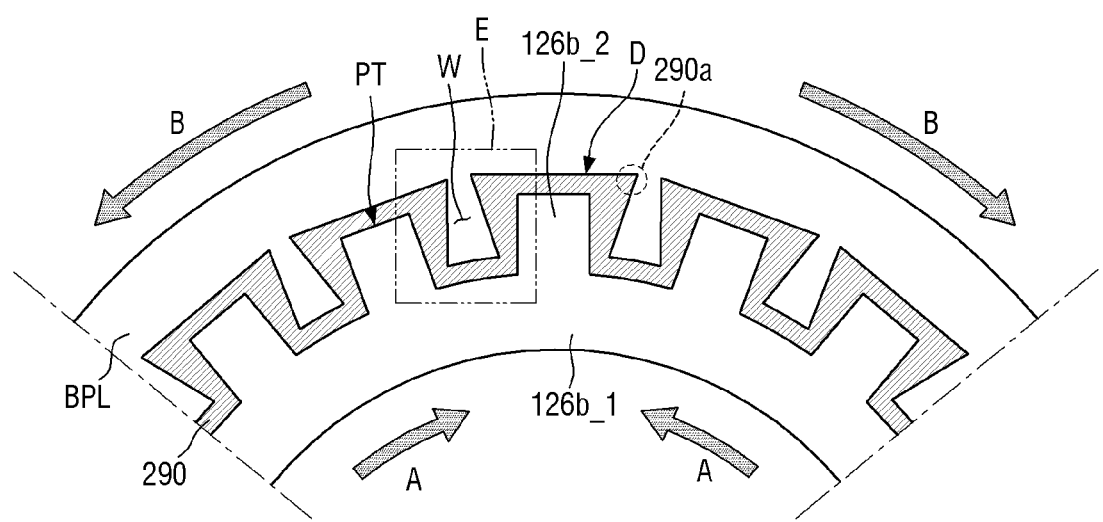
FIGS. 9A and 9B are views for illustrating the principle that delamination of a second bending protective layer is prevented when a display device is bent according to an embodiment.
Figure 9B:
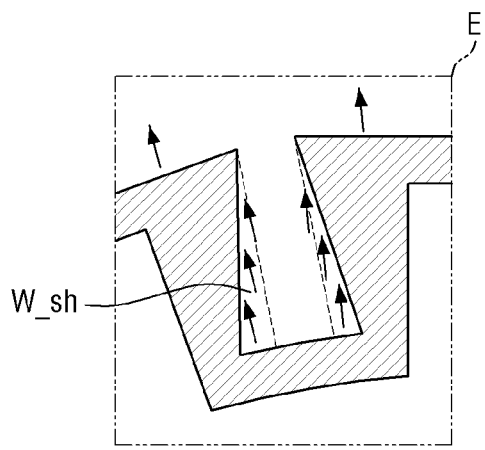

FIGS. 9A and 9B are views for illustrating the principle that delamination of a second bending protective layer BPL is prevented when a display device 1 is bent according to an embodiment. FIG. 9B is an enlarged view of portion E in FIG. 9A.

As described above with reference to FIG. 8, when the anti-delamination structure D and the second bending protective layer BPL which is disposed on the anti-delamination structure D are bent together to have a radius of curvature R, a tensile stress B is applied to the second bending protective layer BPL while a compressive stress A is applied to the anti-delamination structure D.

When the stresses in the different directions are applied as described above, a force to delaminate the second bending protective layer BPL applied on the panel bending region BR from the anti-delamination structure D may act. Such a force may generally work in the vertical direction of the opening W (e.g., along the thickness direction of the display device 1).

Referring to FIG. 9B, a force to delaminate the second bending protective layer BPL may be applied in the opening W along the thickness direction due to the bending stress (e.g., upward arrows in FIG. 9B). Since the second bending protective layer BPL located in the shadow area W_sh of the opening W may be in contact with the outer inclined surface DP1 of the anti-delamination structure D, a resistance against the force to delaminate the second bending protective layer BPL may be generated.

Specifically, according to the embodiment of the disclosure, the outer surface (or the outer inclined surface DP1) of the anti-delamination structure D which extends to the protruding portion 290a, covers the part of the second bending protective layer BPL located in the shadow area W_sh at a lower portion the anti-delamination structure D. Thus, the outer surface of the anti-delamination structure D which is over the part of the second bending protective layer BPL located in the shadow area W_sh acts as a direct resistance to the delamination. In addition, since a larger contact area is obtained by the inclined surfaces of the anti-delamination structure D with respect to the second bending protective layer BPL within the opening W, resistance against the force may be imparted by friction at the interface between these two layers. Accordingly, the anti-delamination structure D can increase the resistance against the delamination force to weaken the delamination force, and can improve the adhesion between the second bending protective layer BPL and the anti-delamination structure D which form an interface therebetween.

Incidentally, the width of the opening W formed by outer surfaces of the adjacent anti-delamination structures D may become larger (e.g., may increase) by bending of the display panel 10 at the panel bending region BR, as compared to an original opening width of the opening W in the display panel 10 which is not bent at the panel bending region BR. When the anti-delamination structure D maintains the inverted taper shape, even in the display panel 10 which is bent as shown in FIGS. 9A and 9B, however, it is possible to more effectively suppress the delamination of the second bending protective layer BPL from other layers such as the second bending protective layer BPL.

Figure 10:
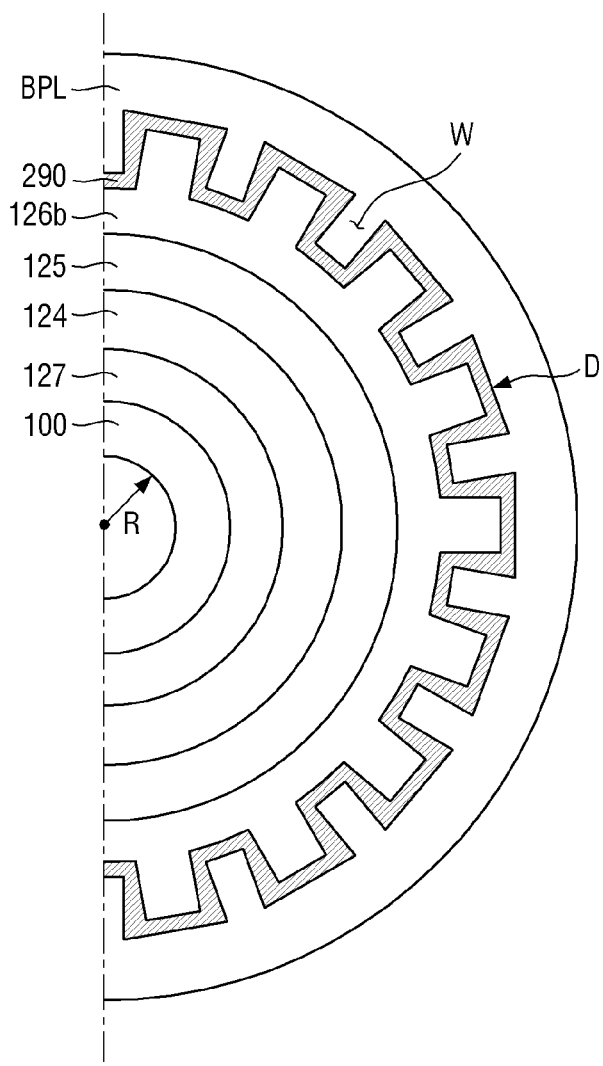
FIG. 10 is a cross-sectional view schematically showing a panel bending region of a display device according to an embodiment.

FIG. 10 is a cross-sectional view schematically showing a panel bending region BR of a display device 1 which is bent, according to an embodiment.

As shown in FIG. 10, when the panel bending region BR of the display device 1 according to an embodiment is bent, the display device 1 has the radius of curvature R. As the radius of curvature R decreases, the bending stress acting on the second bending protective layer BPL and the anti-delamination structure D increases. As described above, it is possible to prevent delamination of the second bending protective layer BPL from the anti-delamination structures D, by the anti-delamination structures D. In this manner, it is possible to improve the adhesion between the second bending protective layer BPL and the anti-delamination structures D.

As a result, the adhesion between the second bending protective layer BPL and the anti-delamination structure D can be improved to reduce the fixing area F of the second bending protective layer BPL described above, which reduces the dead space on the lower side of the display panel 10. Additionally, the radius of curvature R can be reduced, thereby further reducing the dead space on the lower side of the display panel 10.

In addition, as the anti-delamination structures D are arranged regularly and the adhesion between the anti-delamination structures D and the second bending protective layer BPL is improved, a material of the second bending protective layer BPL can be spread more easily when the second bending protective layer BPL is provided on the anti-delamination structures D, so that it is possible to prevent defects such as bubbles.

Hereinafter, a variety of layouts of the anti-delamination structures D each having the inverted taper shape will be described.

Figure 11:
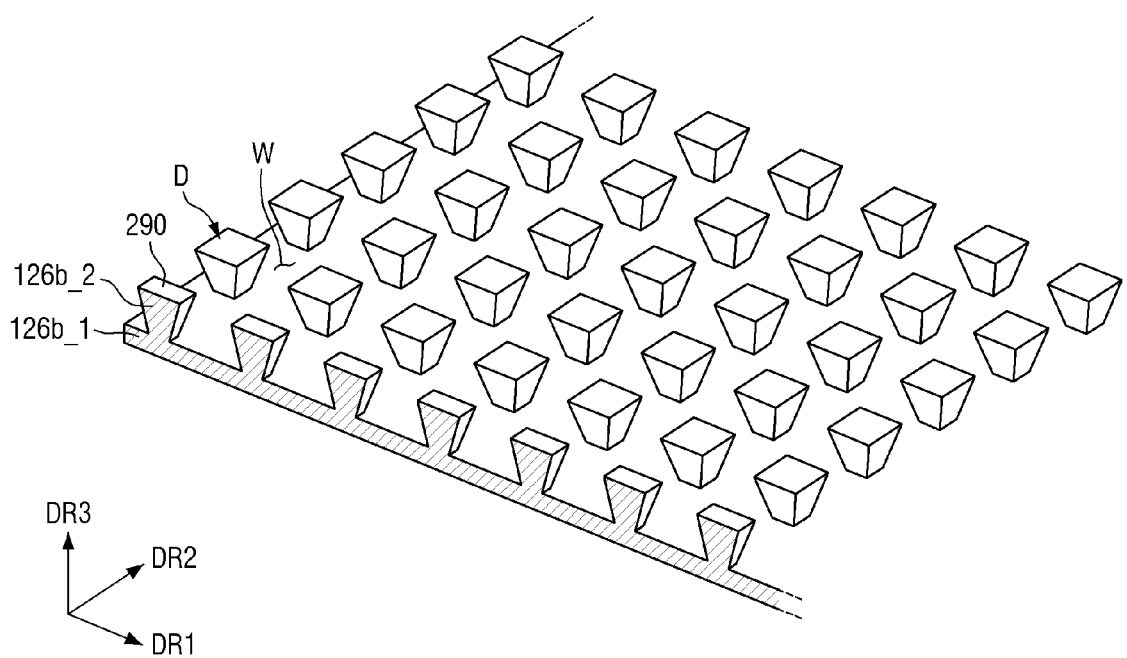
FIG. 11 is a perspective view showing an example of the anti-delamination structures included in the display device of FIG. 3.
Figure 12:
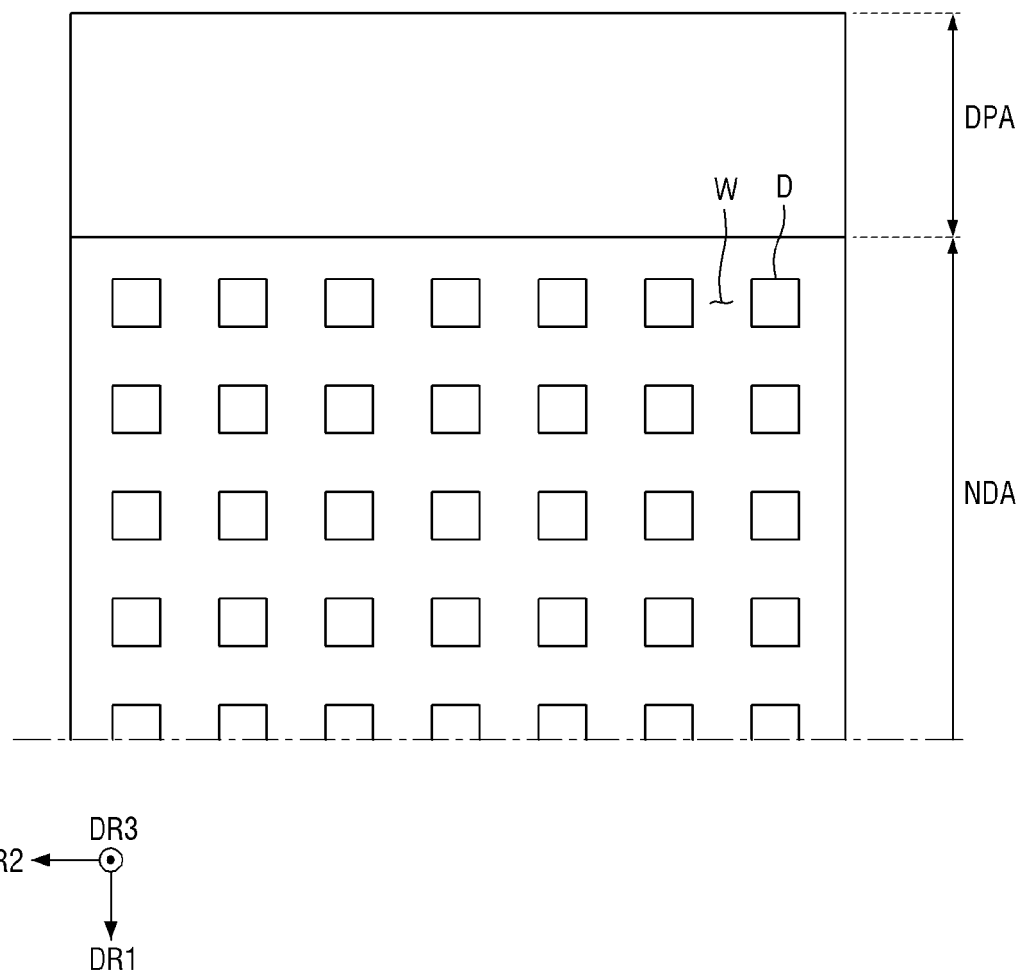
FIG. 12 is a plan view showing an example of the anti-delamination structures included in the display device of FIG. 3.

FIG. 11 is a perspective view showing an example of the anti-delamination structures D included in the display device 1 of FIG. 3. FIG. 12 is a plan view showing an example of the anti-delamination structures D included in the display device 1 of FIG. 3.

Referring to FIGS. 11 and 12, the anti-delamination structures D according to an embodiment of the disclosure may have the cross section in the inverted taper shape, and may include a rectangular or square shape when viewed from the top (e.g., planar shape) in order to increase the resistance against the delamination direction when a delamination force is applied in the thickness direction (indicated as the third direction DR3 in the drawing for convenience of illustration). It is, however, to be understood that the disclosure is not limited thereto. In an embodiment, for example, the upper surface of the anti-delamination structures D may have a quadrangular shape in which adjacent sides form an acute angle or an obtuse angle when viewed from the top.

Although all of the four sides of the anti-delamination structures D form the inverted taper shape according to the embodiment of the disclosure, the disclosure is not limited thereto. In an embodiment, for example, the anti-delamination structures D may include the inverted taper shape only on some of the opposing surfaces, while the other surfaces may not include the inverted taper shape.

As shown in FIG. 12, the plurality of anti-delamination structures D may be spaced apart from one another at a distance in the first direction DR1 and in the second direction DR2 and may be arranged in a matrix pattern when viewed from the top. According to this embodiment, the separation distances in the first direction DR1 and the second direction DR2 between the anti-delamination structures D are uniform, but the disclosure is not limited thereto.

Figure 13:
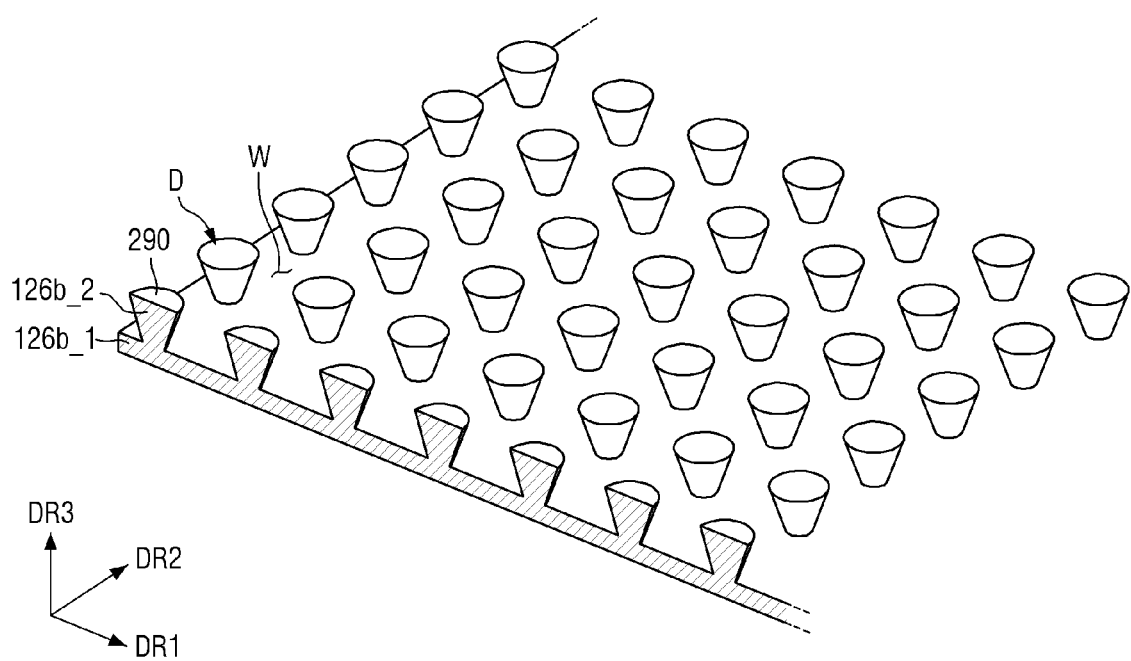
FIGS. 13 to 15 are perspective views of anti-delamination structures according to embodiments of the disclosure.
Figure 14:
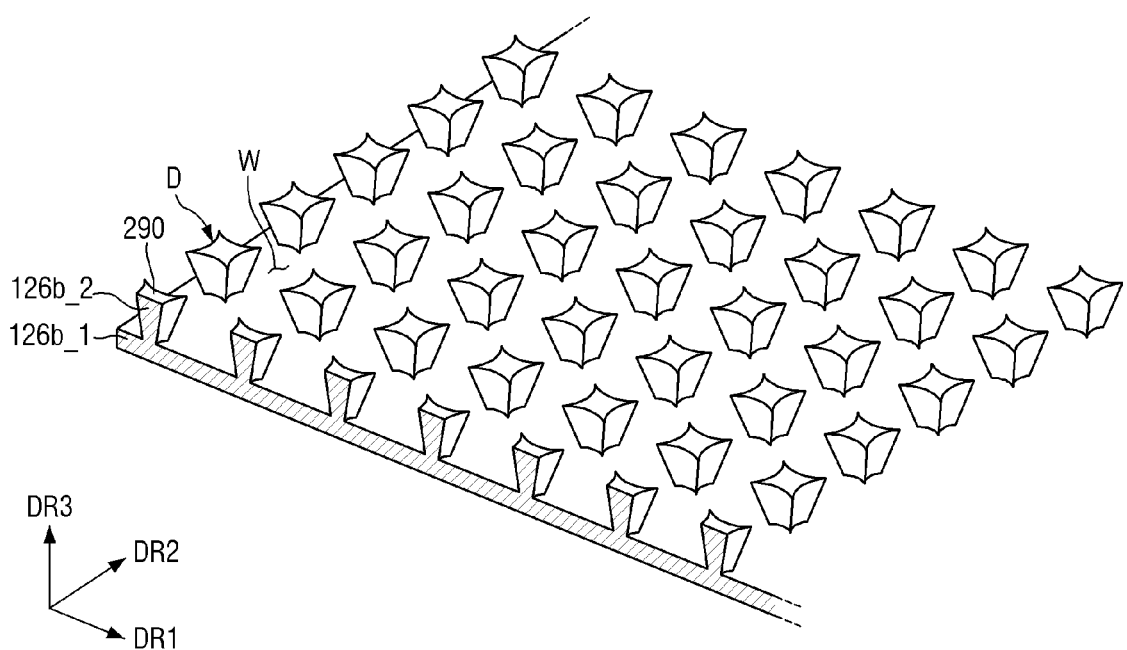
Figure 15:
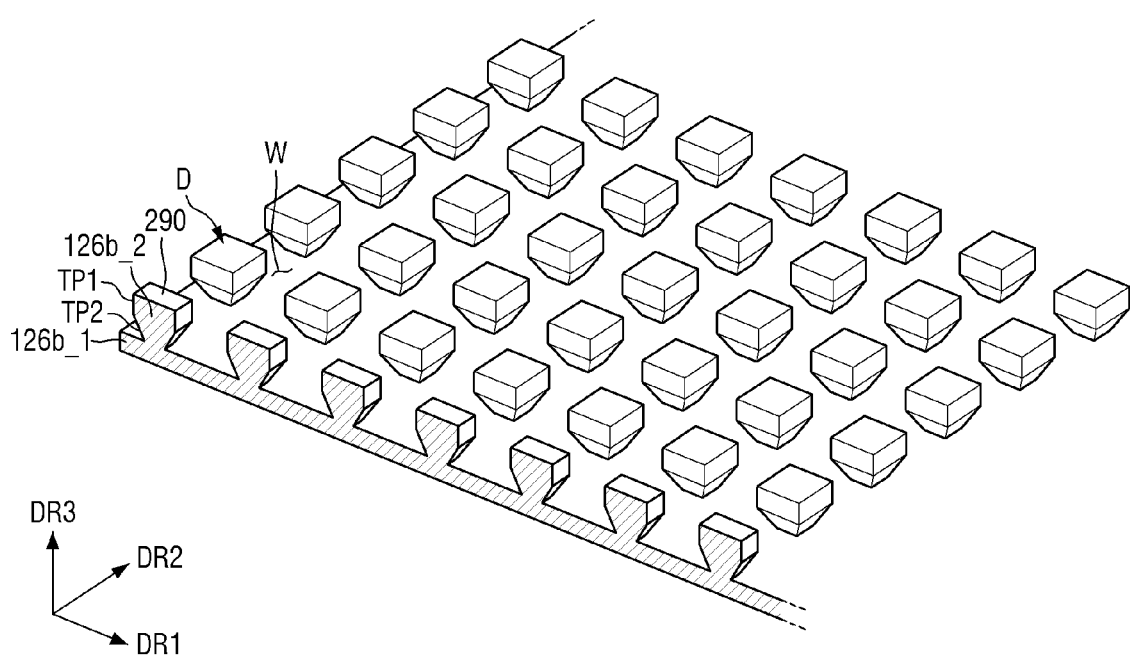

FIGS. 13 to 15 are perspective views of anti-delamination structures D according to various embodiments of the disclosure.

The embodiment of FIG. 13 is different from the embodiment of FIG. 11 in that the anti-delamination structures D have a circular shape when viewed from the top. Specifically, according to this embodiment, the anti-delamination structures D have an inverted taper shape having a circular upper surface and the width (or dimension) decreasing toward the lower side (e.g., the width decreases in a direction from the upper surface to the base 126b_1 of the first bending protective layer 126b). The plana shape of the anti-delamination structures D taken in the horizontal direction may be circular, but the disclosure is not limited thereto.

According to this embodiment, the upper surface of the anti-delamination structures D may have a shape in which the upper surface protrudes further toward the adjacent anti-delamination structures D than the lower surface, so that the opening width of the opening W formed by the adjacent anti-delamination structures D becomes narrower (or decreases) in a direction toward the upper side of the anti-delamination structures D from the base 126b_1. With such a structure, it is possible to suppress the delamination of the second bending protective layer BPL from another layer as the above-described shadow area W_sh is formed.

The embodiment of FIG. 14 is different from the embodiment of FIG. 11 in that anti-delamination structures D include one or more concave surfaces as side surfaces.

Specifically, according to this embodiment, the upper surface and the outer inclined surface DP1 of each of the anti-delamination structures D may include a concave surface depressed toward the center of a respective anti-delamination structure D. In a top plan view, a protruding portion 290a may be disposed at a corner where adjacent concave surfaces meet in each of the anti-delamination structures D.

According to this embodiment, a contact area with the second bending protective layer BPL is increased by the concave surfaces of the anti-delamination structures D. In addition, since the outer inclined surface DP1 has the inverted taper shape, the shadow area W_sh can be formed, thereby effectively suppressing the delamination of the second bending protective layer BPL.

The embodiment of FIG. 15 is different from the embodiment of FIG. 11 in that each of anti-delamination structures D has a polygonal cross-section, and includes a first inclined portion TP1 having a first slope, and a second inclined portion TP2 having a second slope under the first inclined portion TP and closer to the base 126b_1. The first slope is different from the second slope, and at least one of the slopes forms an inverted taper slope.

Also in this embodiment, the shadow area W_sh can be formed under the first inclined portion TP1 and/or the second inclined portion TP2 to suppress the delamination of the second bending protective layer BPL.

Figure 16:
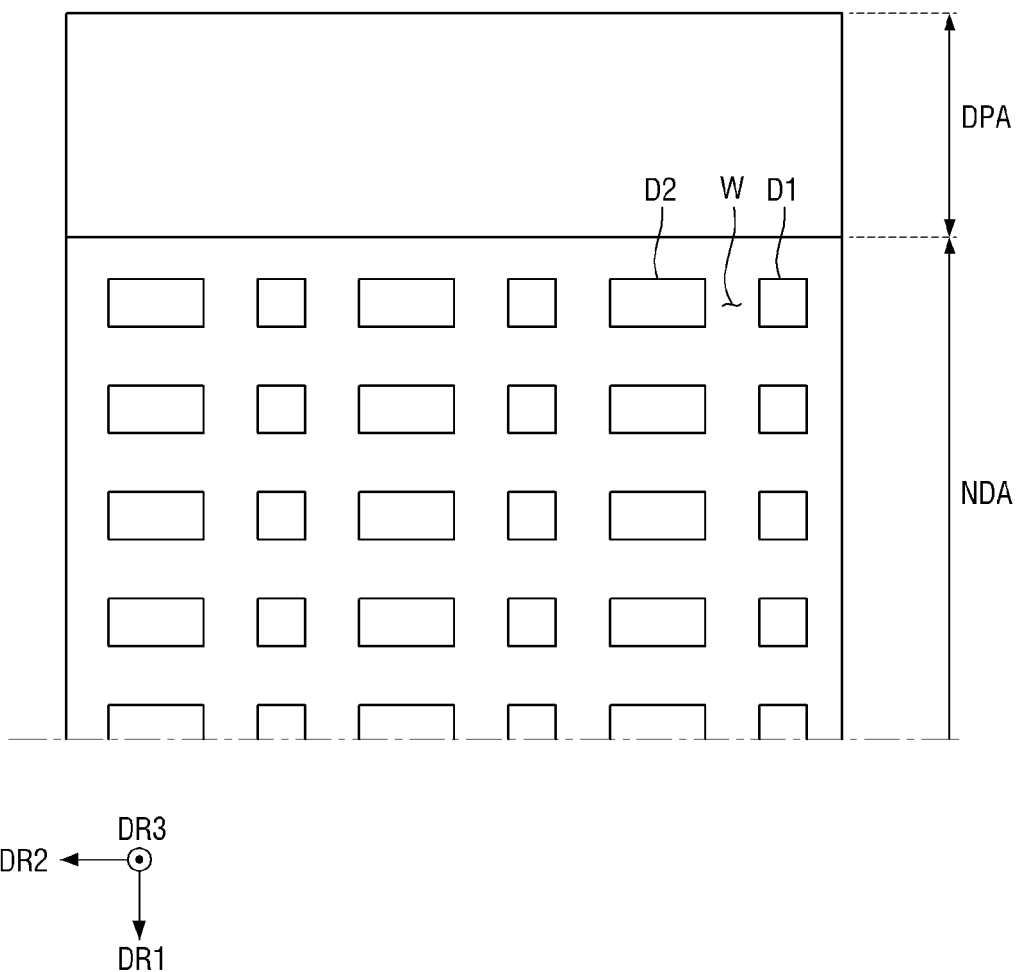
FIGS. 16 and 17 are plan views of anti-delamination structures according to embodiments of the disclosure.
Figure 17:
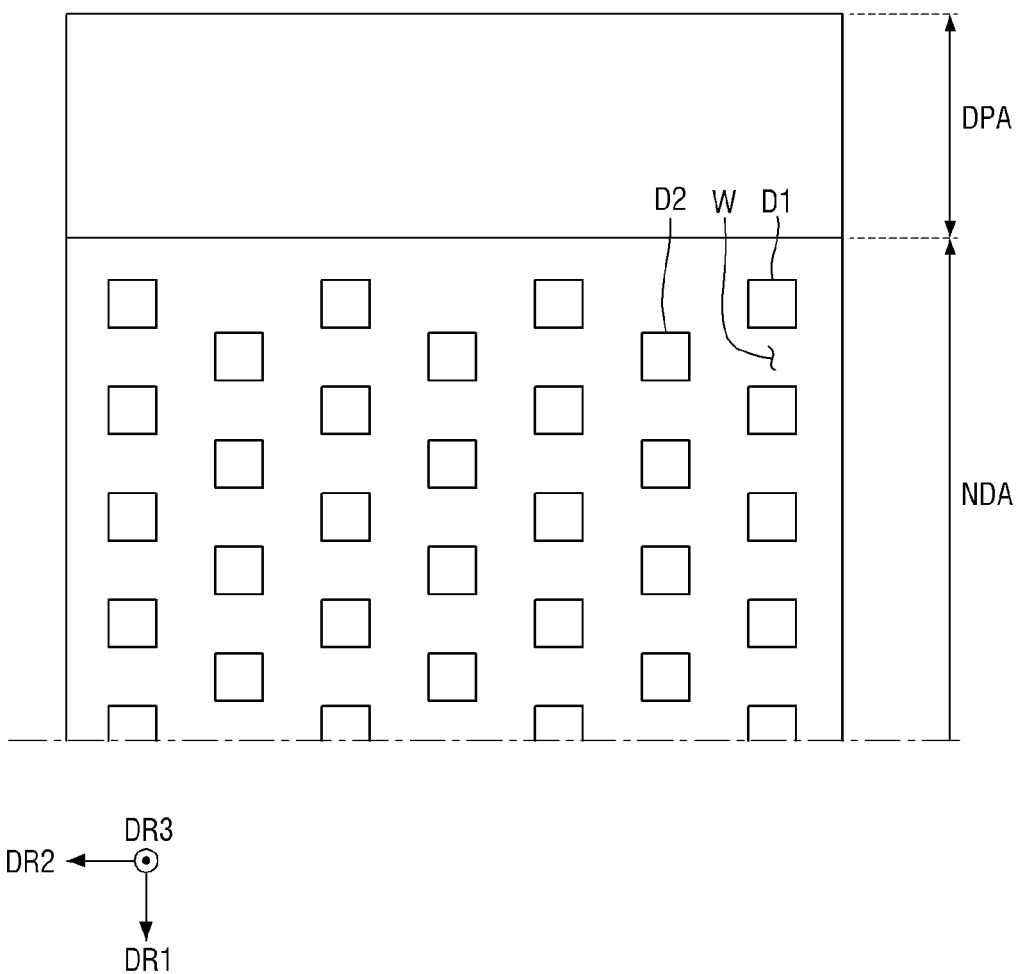

FIGS. 16 and 17 are plan views of anti-delamination structures D according to various embodiments of the disclosure.

The embodiment of FIG. 16 is different from the embodiment of FIG. 12 in that adjacent anti-delamination structures D have different planar areas when viewed from the top.

Specifically, according to this embodiment, the anti-delamination structures D include first anti-delamination structures D1 having a first area (e.g., first planar area) and second anti-delamination structures D2 having a second area (e.g., second planar area) larger than the first area when viewed from the top, which are arranged alternately in the second direction DR2.

According to an embodiment of the disclosure, in the second direction DR2, the width of the first anti-delamination structures D1 may be smaller than the width of the second anti-delamination structures D2 spaced apart from an adjacent first anti-delamination structure D in the second direction DR2. In the first direction DR1, the width of the first anti-delamination structures D1 may be equal to that of the second anti-delamination structures D2 when viewed from the top. It is, however, to be understood that the disclosure is not limited thereto. In an embodiment, for example, the first anti-delamination structures D1 and the second anti-delamination structures D2 may include a circular shape or the like when viewed from the top.

Although the first anti-delamination structures D1 and the second anti-delamination structures D2 are arranged in the second direction DR2 in the drawings, the anti-delamination structures D having different widths may be alternately arranged in the first direction DR1.

The embodiment of FIG. 17 is different from the embodiment of FIG. 12 in that anti-delamination structures D are arranged in staggered rows in the second direction DR2 when viewed from the top.

Specifically, the first anti-delamination structures D1 and the second anti-delamination structures D2 are alternately arranged in the second direction DR2, and may be staggered with each other in the second direction DR2.

It is, however, to be understood that this is merely illustrative but is not limiting. In an embodiment, for example, the first anti-delamination structures D1 and the second anti-delamination structures D2 have a circular shape or the like when viewed from the top, and the area of the first anti-delamination structures D1 may be different from that of the second anti-delamination structures D2 spaced apart from them in the second direction DR2.

Accordingly, when the second bending protective layer BPL applied in the opening W formed by the first anti-delamination structures D1 adjacent to each other in the first direction DR1 is delaminated, it is possible to prevent that the second anti-delamination structures D2 adjacent to each other in the second direction DR2 are delaminated one after another.

Figure 18:
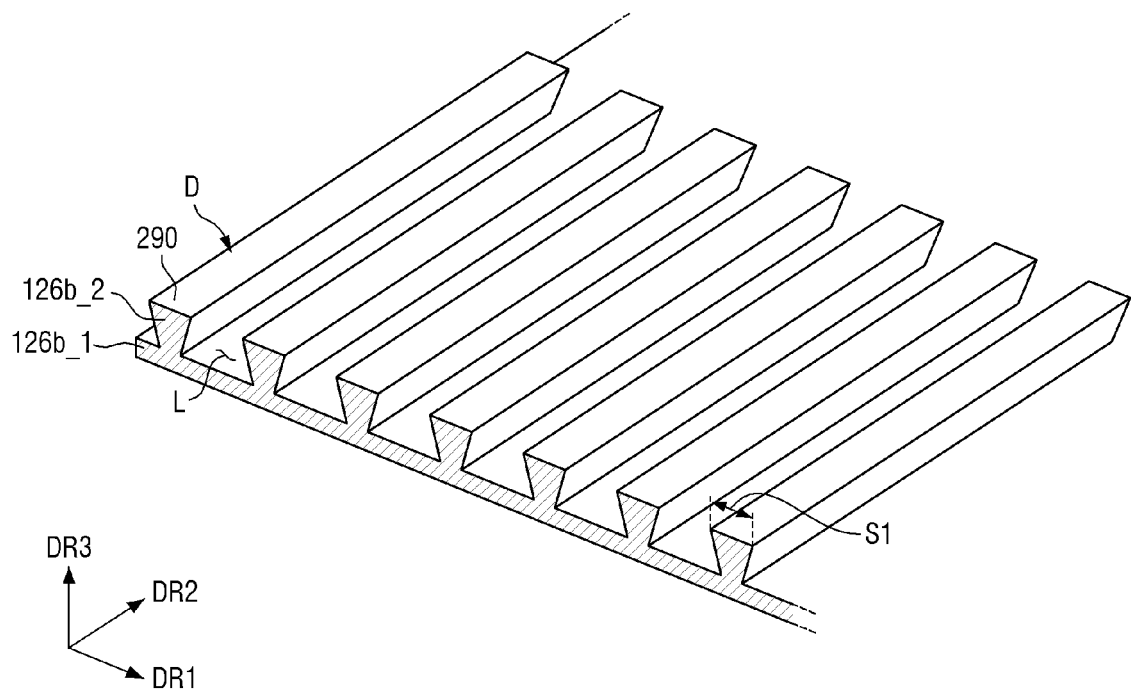
FIG. 18 is a perspective view of anti-delamination structures according to an embodiment of the disclosure.
Figure 19:
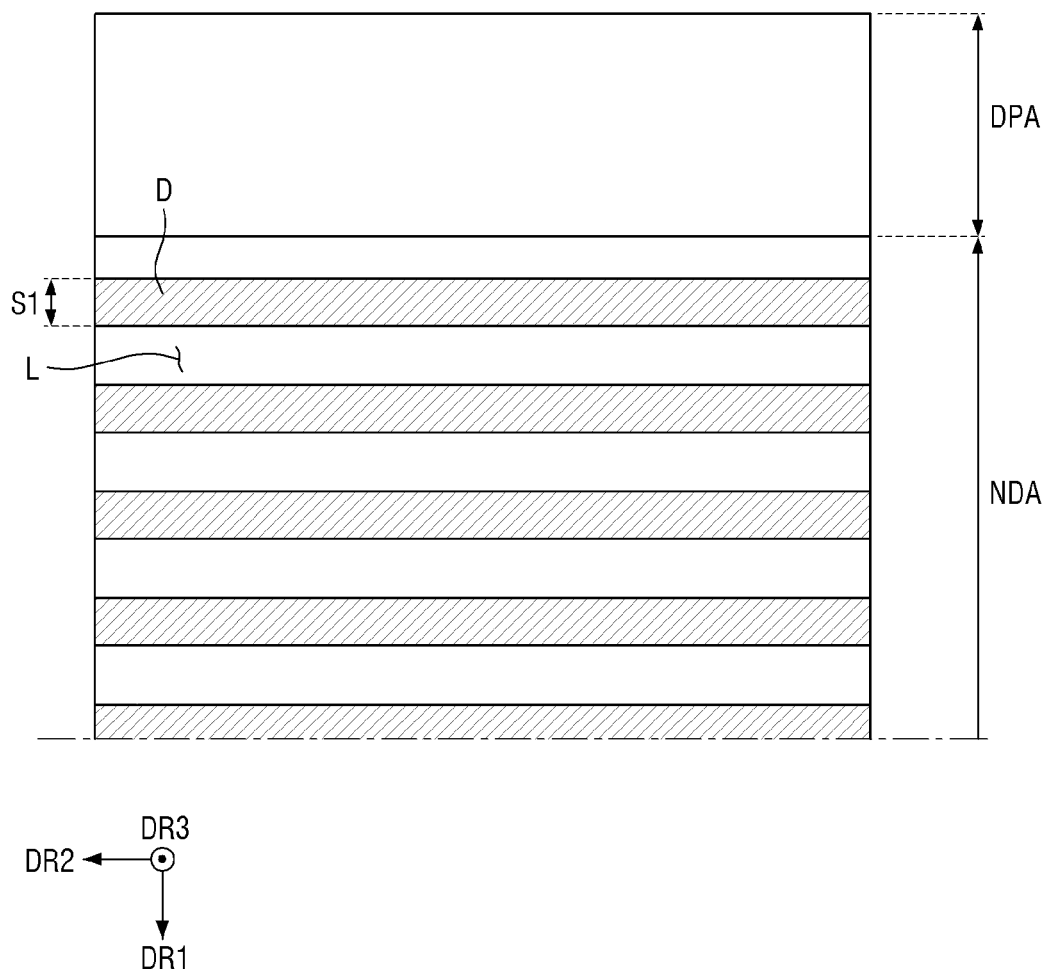
FIG. 19 is a plan view of the anti-delamination structures of FIG. 18.

FIG. 18 is a perspective view of anti-delamination structures D according to an embodiment of the disclosure. FIG. 19 is a plan view of the anti-delamination structures D of FIG. 18.

According to the embodiments of FIGS. 18 and 19, anti-delamination structures D in an inverted taper shape are arranged adjacent to each other in the first direction DR1 such that they are spaced apart from one another at a constant distance, and may be extended in the second direction DR2 in the form of lines (e.g., stripes) to have a major dimension in the second direction DR2. As shown in FIGS. 18 and 19, an anti-delamination structure width S1 of an anti-delamination structure D in the first direction DR1 when viewed from the top may be equal to the anti-delamination structure width S1 of another anti-delamination structure D spaced apart from it in the first direction DR1 and disposed in the form of line. It should be understood, however, that the disclosure is not limited thereto. The distance between adjacent anti-delamination structures D spaced apart from each other in the first direction DR1 may be different, or different anti-delamination structures D may have different anti-delamination structure widths 51 and/or distances.

Figure 20:
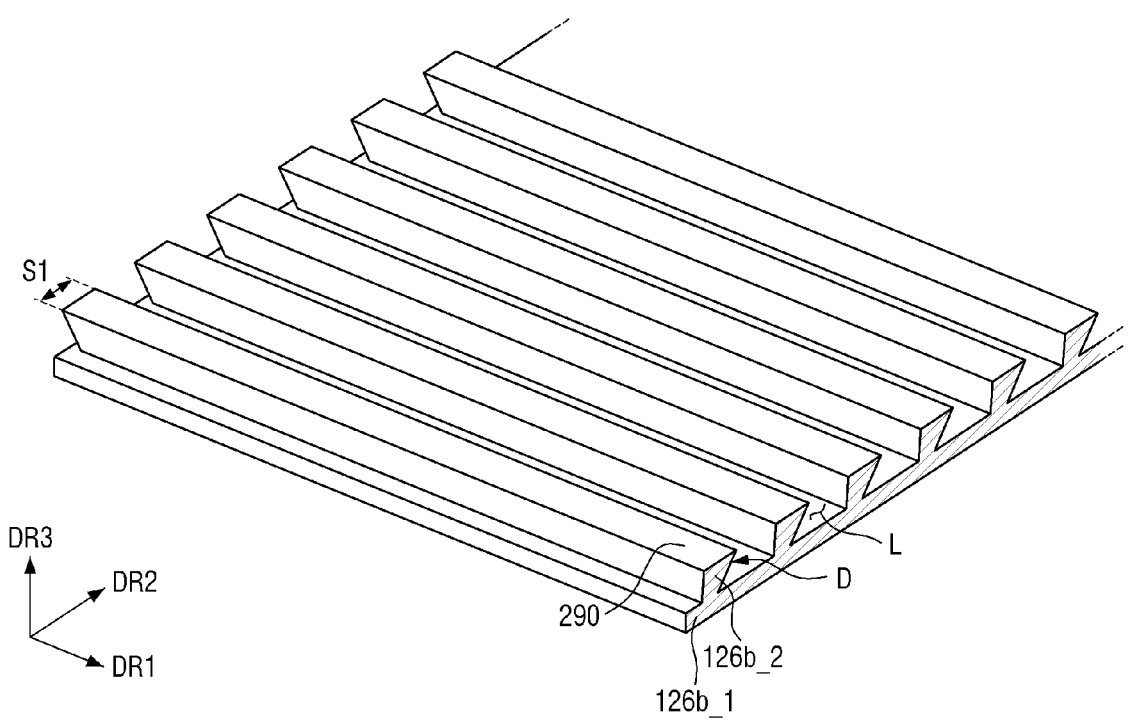
FIG. 20 is a perspective view of anti-delamination structures according to an embodiment of the disclosure.

FIG. 20 is a perspective view of anti-delamination structures D according to an embodiment of the disclosure.

The embodiment of FIG. 20 is different from the embodiment of FIG. 18 in that anti-delamination structures D are extended and arranged in a different direction.

That is to say, the anti-delamination structures D may be spaced apart from one another in the second direction DR2, and may be extended in the first direction DR1 in the form of lines.

According to the above-described embodiments of FIGS. 18 and 20, line-shaped shadow areas W_sh may be formed under the anti-delamination structures D in the form of lines. In this manner, when the second bending protective layer BPL is applied along the line-shaped opening L formed by the anti-delamination structures D having the inverted taper shape which are disposed adjacent to each other in the form of lines, the contact area between the second bending protective layer BPL and the outer inclined surface DP1 of the anti-delamination structures D arranged in the line shape can be increased. As a result, it is possible to increase the resistance against the force to delaminate the second bending protective layer BPL. In addition, even if a part of the second bending protective layer BPL applied in the line-shaped opening L is delaminated, it is possible to prevent delamination of the other part of the anti-delamination structures D.

Figure 21:
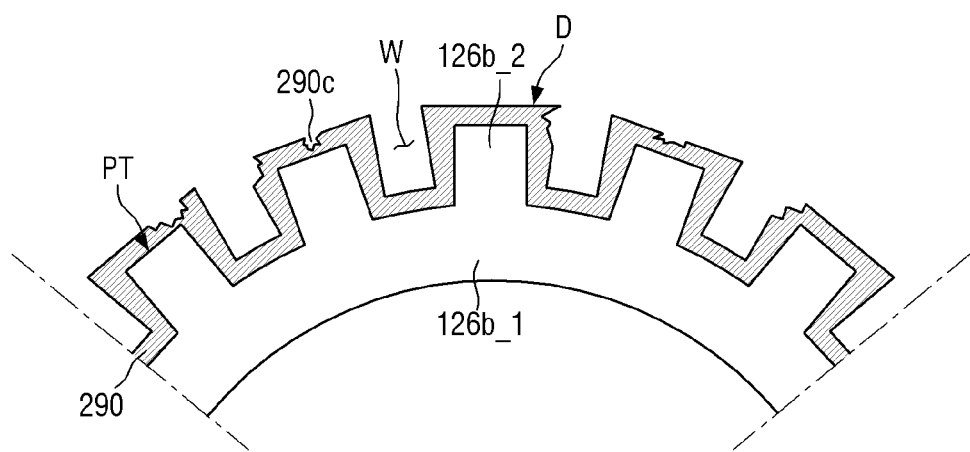
FIG. 21 is a cross-sectional view of anti-delamination structures according to an embodiment of the disclosure.

FIG. 21 is a cross-sectional view of anti-delamination structures D according to an embodiment of the disclosure.

In the embodiment of FIG. 21, a part of a bending inorganic layer 290 of an anti-delamination structure D may further include a crack 290c.

Since the bending inorganic layer 290 is located in the panel bending region BR, it is exposed to bending stress, and thus cracks 290c may occur in a part of the bending inorganic layer 290 as shown in FIG. 21. Usually, when cracks are formed in an inorganic layer, they may propagate along the inorganic layer and may affect the display quality. However, when cracks 290c are generated in the bending inorganic layer 290, propagation can be suppressed by the shape of the protrusion pattern 126b_2 thereunder. In addition, when the bending inorganic layer 290 is formed separately from the layers of the display area DPA, even if the cracks 290c propagate, they cannot affect the layers of the display area DPA.

On the other hand, since the second bending protective layer BPL is formed even in the cracks 290c formed in the bending inorganic layer 290, the adhesion between the second bending protective layer BPL and the anti-delamination structures D can be even enhanced due to an increased contact area between the second bending protective layer BPL and the bending inorganic layer 290 at the cracks 290c. Therefore, the cracks 290c formed in the bending inorganic layer 290 can help suppress the delamination of the second bending protective layer BPL.

Hereinafter, a method of fabricating (or providing) a display device 1 will be described in detail with reference to FIGS. 22 to 25.

FIGS. 22 to 25 are cross-sectional views for illustrating structures and processes in the method of fabricating (or providing) a display device 1 according to an embodiment of the disclosure.

Figure 22:
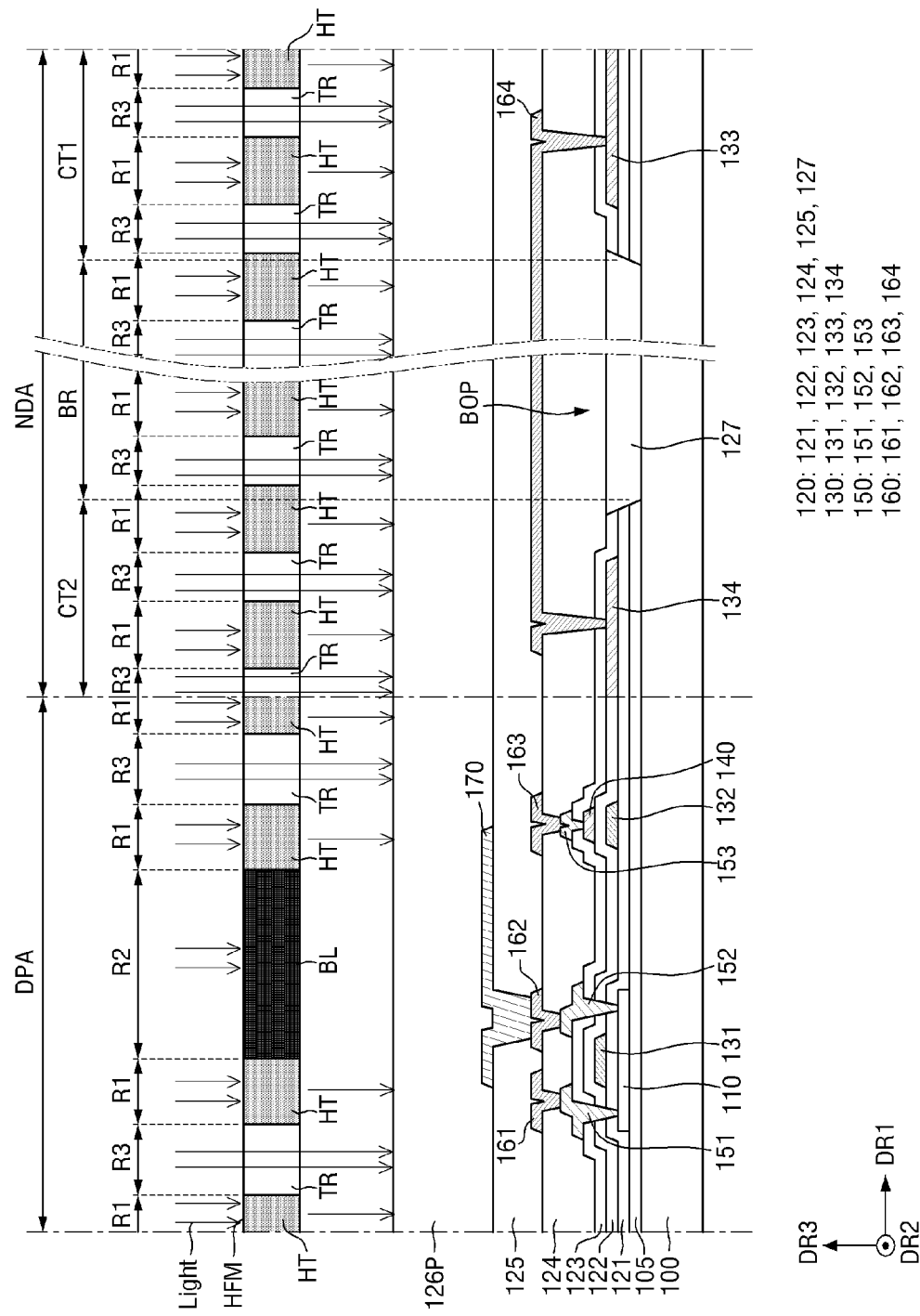
FIGS. 22 to 25 are cross-sectional views for illustrating structures and processes in a method of fabricating (or providing) a display device according to an embodiment of the disclosure.

Referring to FIG. 22, an intermediate structure is prepared, in which a buffer layer 105, a semiconductor layer 110, a first insulating layer 121, a first conductive layer 130, a second insulating layer 122, a second conductive layer 140, a third insulating layer 123, a bending insulating layer 127, a third conductive layer 150, a fourth insulating layer 124, a fourth conductive layer 160, a fifth insulating layer 125 and a fifth conductive layer 170 are sequentially stacked on one another on the substrate 100. A variety of methods for forming such an intermediate structure are well known in the art and thus are not described herein.

Subsequently, an organic material layer 126p for a sixth insulating layer 126 is disposed on the fifth conductive layer 170.

Subsequently, the organic material layer 126p for the sixth insulating layer 126 is patterned by performing exposure and development using a halftone mask HFM. The halftone mask HFM includes a light-blocking portion BL, a first light-transmitting portion HT, and a second light-transmitting portion TR having a transmittance greater than that of the first light-transmitting portion HT. An example where the organic material layer 126p for the sixth insulating layer 126 includes a negative photosensitive material will be described. The light-blocking portion BL is placed in line with a second region R2 in which the opening of the pixel-defining layer 126a_1 of the display area DPA is to be formed. The first light-transmitting portion HT is placed in line with a first region R1 in which the pixel-defining layer 126a_1 of the display area DPA and the base 126b_1 of the non-display area NDA are to be formed. The halftone mask HFM is placed such that the second light-transmitting portion TR is in line with the third region R3 in which the spacer 126a_2 of the display area DPA and the protrusion pattern 126b_2 of the non-display area NDA are to be formed. The organic material layer 126p for the sixth insulating layer 126 is exposed to light using the halftone mask HFM.

Figure 23:
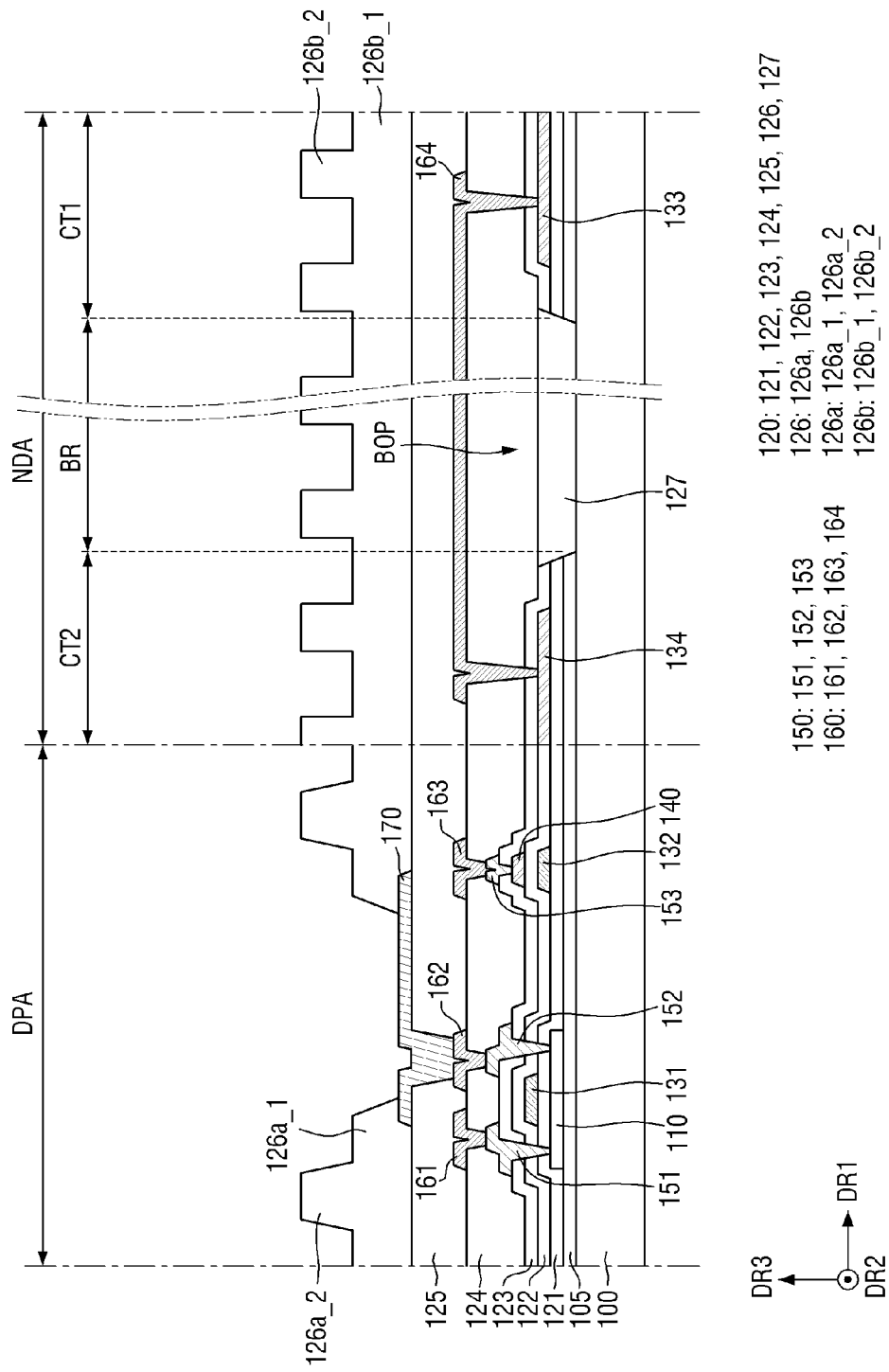

Subsequently, the organic material layer 126p for the sixth insulating layer 126 is developed after it is exposed to light. As a result, the pattern shape of the six insulating layer 126 including a pixel partition wall 126a including the pixel-defining layer 126a_1 and the spacer 126a_2, and a first bending protective layer 126b including the base 126b_1 and the protrusion pattern 126b_2 is completed, as shown in FIG. 23. By performing the process using a halftone mask HFM in this manner, the pixel partition wall 126a including the pixel-defining layer 126a_1 and the spacer 126a_2, and the first bending protective layer 126b including the base 126b_1 and the protrusion pattern 126b_2 can be formed simultaneously via the single process, so that the process efficiency can be increased.

Figure 24:
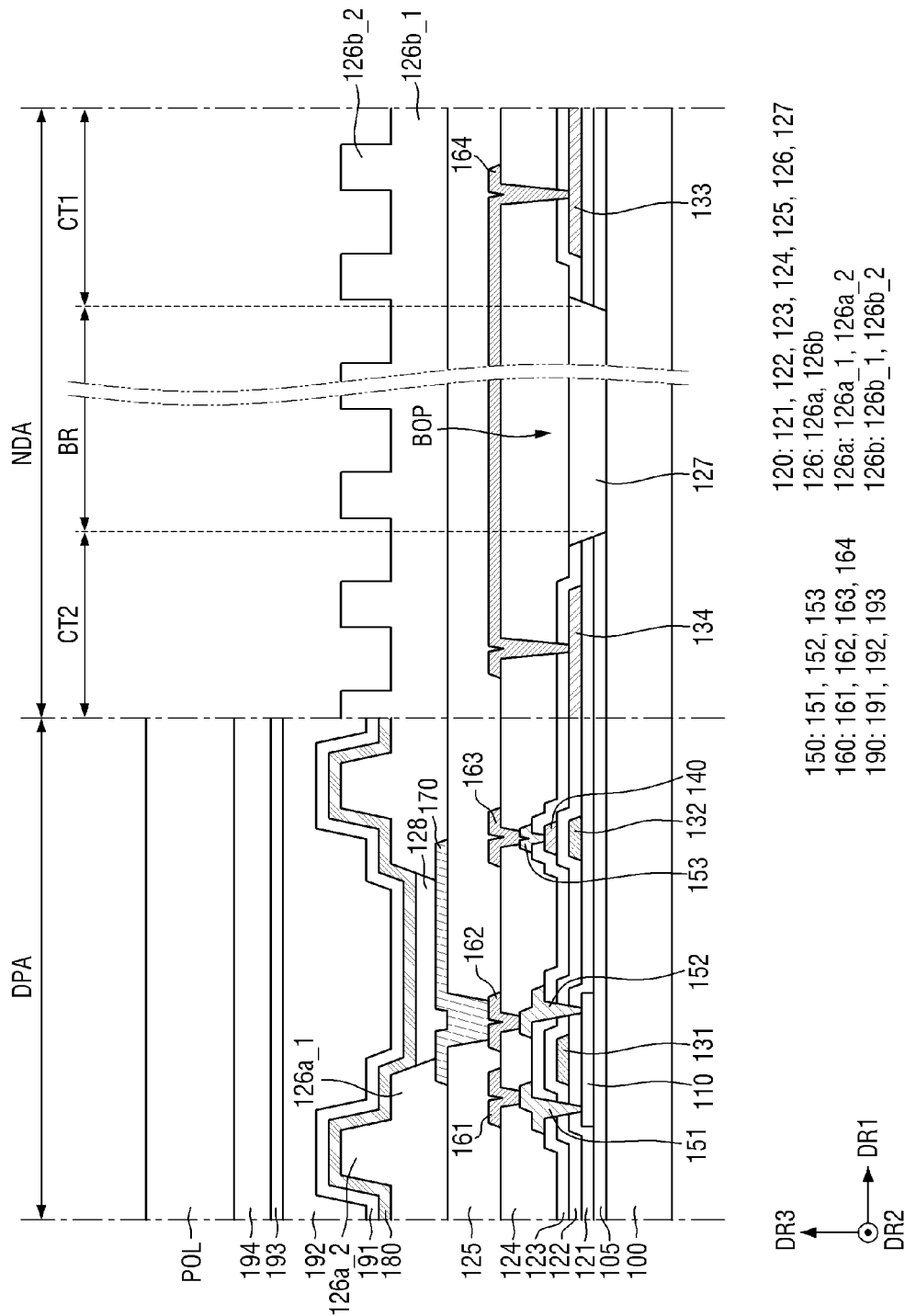

Subsequently, referring to FIG. 24, an emissive layer 128, a sixth conductive layer 180, a first inorganic layer 191, an organic layer 192, a second inorganic layer 193, an adhesive layer 194, and a polarization layer POL are formed on the display area DPA by any of a variety of methods well known in the art.

Figure 25:
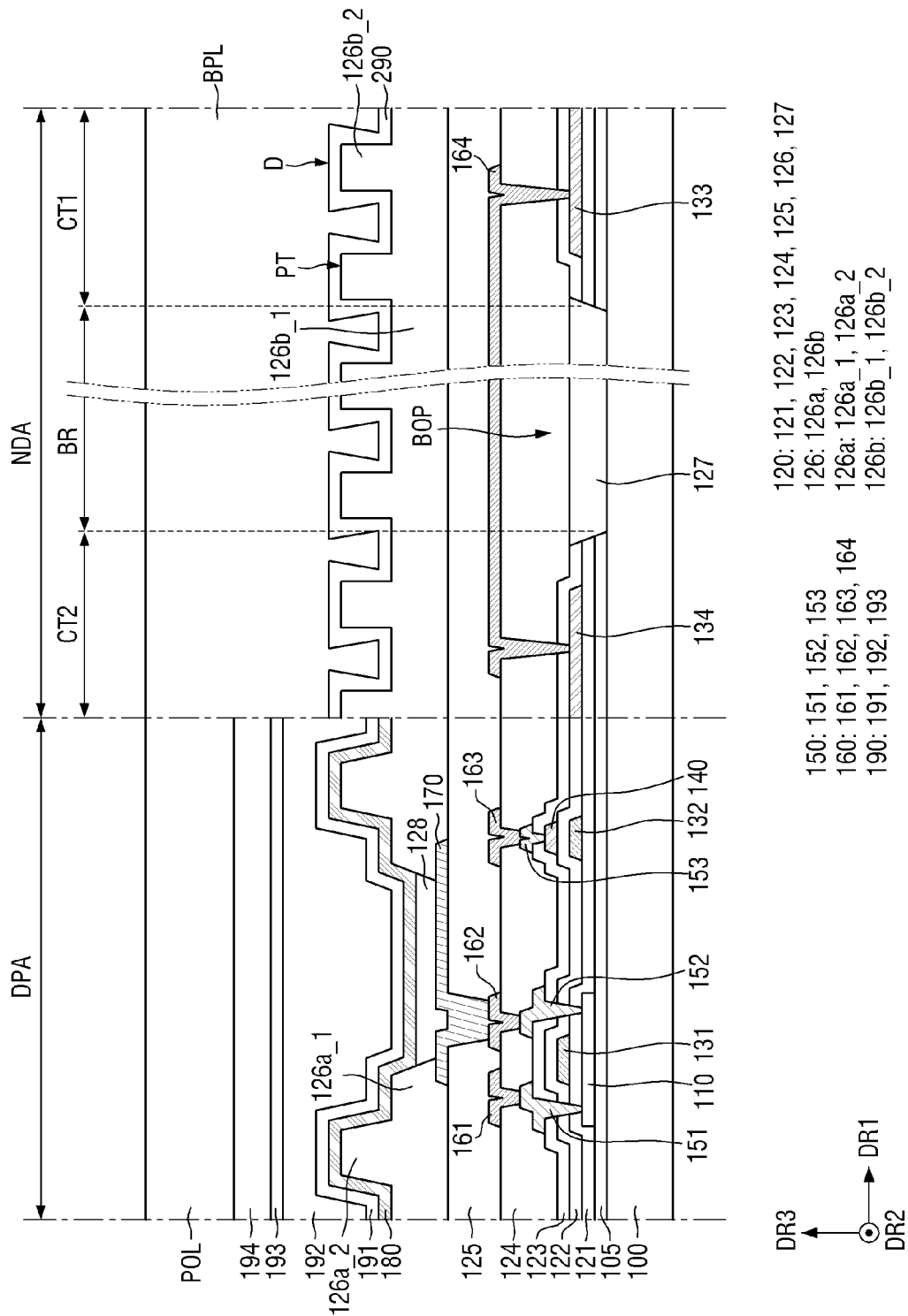
Figure 26:
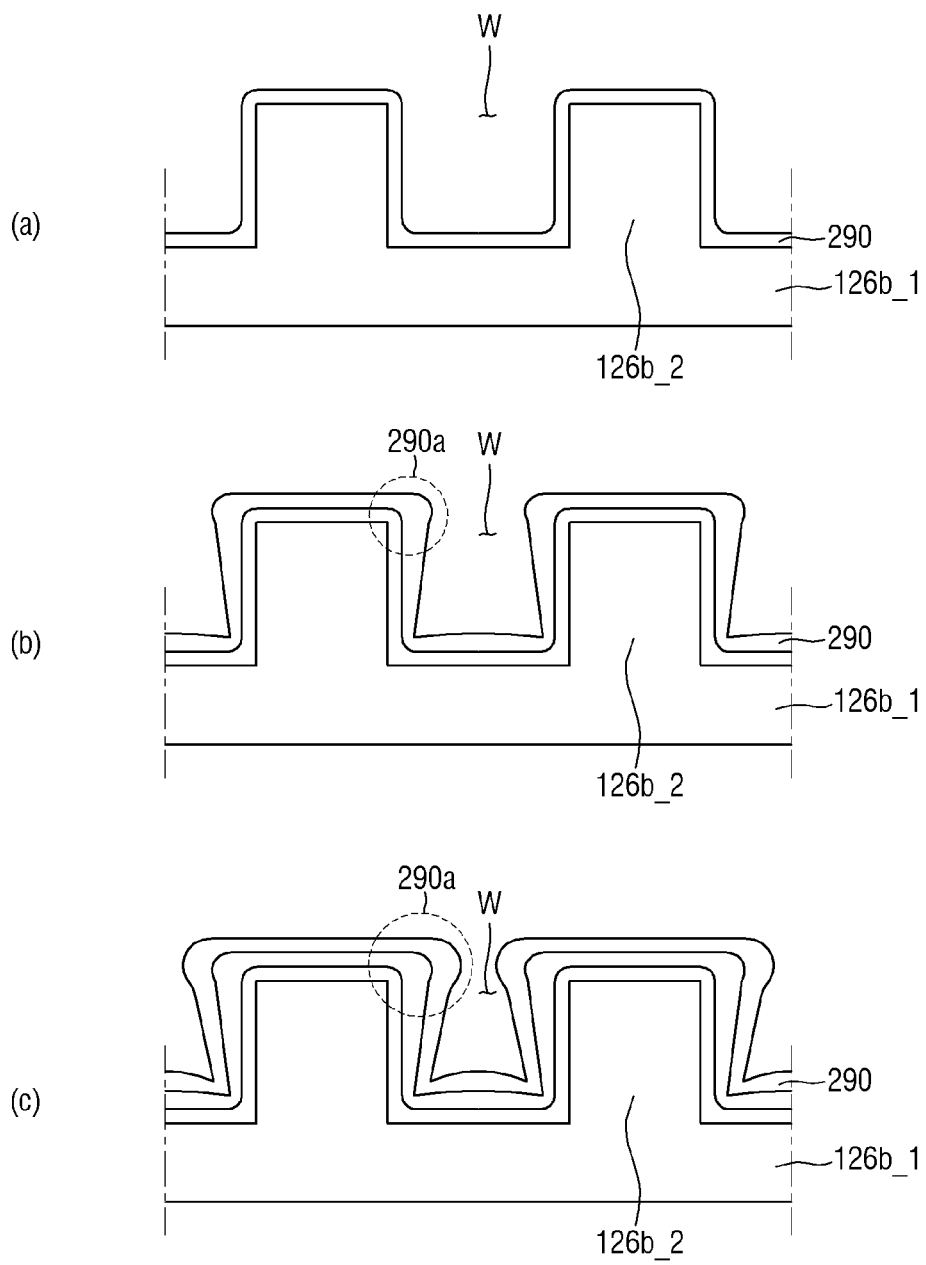
FIGS. 26A to 26C are cross-sectional views illustrating a process of depositing a bending inorganic layer by chemical vapor deposition according to an embodiment.

Subsequently, referring to FIG. 25, a bending inorganic layer 290 is formed on the first bending protective layer 126b of the non-display area NDA. The bending inorganic layer 290 is formed by any of various CVD deposition techniques such as plasma enhanced chemical vapor deposition (PECVD), atmospheric pressure CVD (APCVD), and low-pressure CVD (LPCVD). As the bending inorganic layer 290 is formed, the anti-delamination structures D including the protrusion pattern 126b_2 of the first bending protective layer 126b and the bending inorganic layer 290 is completed. The bending inorganic layer 290 has an outer inclined surface DP1 in an inverted taper shape on the protrusion pattern 126b_2, which will be described in detail with reference to FIG. 26.

Subsequently, the second bending protective layer BPL is applied on the bending inorganic layer 290 to complete the display device 1 as shown in FIG. 3.

FIGS. 26A to 26C are cross-sectional views illustrating a process of depositing a bending inorganic layer 290 by chemical vapor deposition according to an embodiment.

Referring to FIG. 26A, according to an embodiment of the disclosure, the bending inorganic layer 290 is disposed on the base 126b_1 and the protrusion pattern 126b_2 of the first bending protective layer 126b, by chemical vapor deposition (CVD). In this step, the bending inorganic layer 290 is formed conformally on the surface shape of the first bending protective layer 126b with a thin thickness.

In the chemical vapor deposition process, deposition and growth may be performed isotropically. Specifically, if the deposition process is continued, a thin layer may be grown in the lateral direction of the protrusion PT and away from the protrusion PT. Such thin layers as shown between the bending inorganic layer 290 and the first bending protective layer 126b in FIGS. 26B and 26C, which are grown in the lateral direction at the upper portion of the protrusion PT may narrow the entrance of the opening W at an upper side to provide the protruding portion 290a, and thus the maximum thickness increase at the protruding portion 290a may work as a deposition shadow that hinders deposition. This becomes larger as deposition and growth continue, and accordingly, the outer inclined portion of the bending inorganic layer 290 can have the inverted taper shape as shown in FIGS. 26B and 26C. As a result, as shown in FIG. 26C, a difference in the thickness of the bending inorganic layer 290 within the opening W occurs, and the opening width of the opening W may become narrower toward the upper side. In an embodiment, a minimum opening width of the opening W may be defined by protruding portions 290a opposing each other at the upper side of the opening W (e.g., entrance of the opening W). That is, the anti-delamination protrusion structure has an inverted taper shape with a maximum dimension of the protrusion structures at a distal end thereof.

Figure 27:
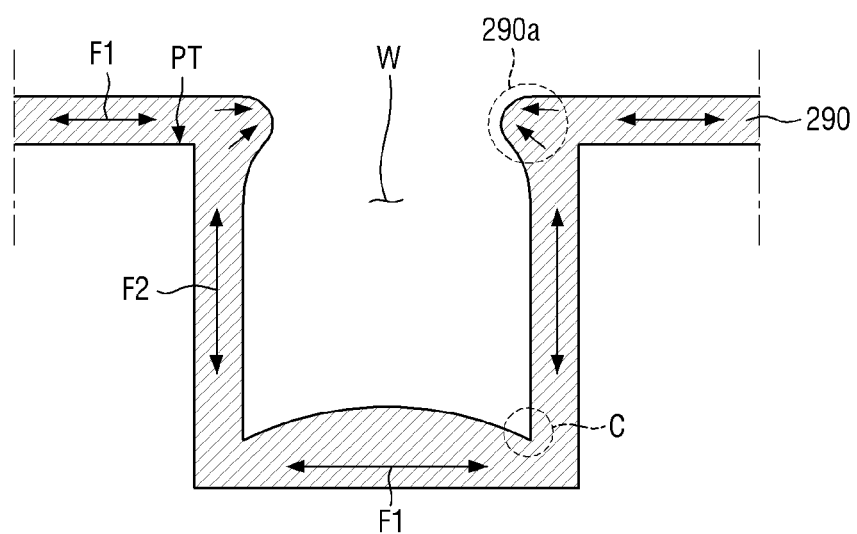
FIG. 27 is a view showing a force acting in a process of depositing a bending inorganic layer according to an embodiment.

FIG. 27 is a view showing a force acting in a process of depositing a bending inorganic layer 290 according to an embodiment.

Referring to FIG. 27, when the bending inorganic layer 290 is deposited on the protrusion PT, a tensile stress may act between inorganic materials. When such tensile stress acts, the inorganic material is maximally stretched in the horizontal direction by a first force F1 and in the vertical direction by a second force F2. In addition, the first force F1 in the horizontal direction and the second force F2 in the vertical direction overlap each other at the edge of the bending inorganic layer 290 deposited on the upper surface of the protrusion PT. As a result, the forces combine to act in the direction of forming the protruding portion 290a (inclined arrows in FIG. 27).

In addition, as the first force F1 in the horizontal direction and the second force F2 in the vertical direction overlap each other at the corners C at opposing sides of the upper surface of the bending inorganic layer 290 deposited lowest in the opening W, the compressive force acts, to form the inverted taper structure.

As such, due to the deposition shadow action of the inorganic material and/or the action of tensile stress between the inorganic materials described above with reference to FIG. 26, it is possible to form the outer inclined surface DP1 in the inverted taper shape by the bending inorganic layer 290, even when the protrusion PT underlying the bending inorganic layer 290 does not have the inverted taper shape.

In concluding the detailed description, those skilled in the art will appreciate that many variations and modifications can be made to the embodiments without substantially departing from the principles of the invention. Therefore, the disclosed embodiments of the invention are used in a generic and descriptive sense only and not for purposes of limitation.

What is claimed is:

1. A display device comprising:
    a substrate comprising a display area and a bending region which is adjacent to the display area;
    a pixel partition wall layer on the substrate and comprising a pixel-defining layer in the display area;
    a first bending protective layer on the substrate and comprising a protrusion pattern in the bending region, the protrusion pattern comprising a base, and a plurality of protrusions which are integral with the base and each extend from the base; and
    a bending inorganic layer on the protrusion pattern of the first bending protective layer, in the bending region, the bending inorganic layer including an outer surface having an inverted taper shape with respect to the substrate.

2. The display device of claim 1, wherein the pixel partition wall layer in the display area and the first bending protective layer in the bending region include a same material.

3. The display device of claim 2, wherein
    the pixel partition wall layer further comprises a spacer which is on the pixel-defining layer and integral with the pixel-defining layer,
    each of the protrusion pattern and the spacer has a height taken from the substrate, and
    the height of the protrusion pattern is equal to the height of the spacer.

4. The display device of claim 1, further comprising in the bending region, a second bending protective layer on the first bending protective layer.

5. The display device of claim 4, wherein
    the protrusion pattern of the first bending protective layer includes an upper portion, and a lower portion which is closer to the substrate than the upper portion, and
    in a direction along the substrate, the bending inorganic layer at the upper portion of the protrusion pattern extends further from the protrusion pattern than the bending inorganic layer at the lower portion of the protrusion pattern.

6. The display device of claim 5, wherein
    the protrusion pattern comprises a base, and a plurality of protrusions which are spaced apart from each other with a portion of the base therebetween, and
    the bending inorganic layer at the upper portion of the protrusion pattern, overlaps the portion of the base, to define a shadow area between the bending inorganic layer at the upper portion of the protrusion pattern and the portion of the base.

7. The display device of claim 6, wherein the shadow area is filled with the second bending protective layer.

8. The display device of claim 1, further comprising in the display area, an encapsulation layer on the pixel-defining layer,
    wherein the encapsulation layer comprises a first inorganic layer, an organic layer on the first inorganic layer, and a second inorganic layer on the organic layer.

9. The display device of claim 8, wherein the bending inorganic layer comprises a same material as the first inorganic layer or the second inorganic layer of the encapsulation layer.

10. The display device of claim 1, wherein in the bending region, the protrusion pattern of the first bending protective layer comprises a plurality of protrusions spaced apart from each other and each comprising an outer surface having the inverted taper shape.

11. A display device comprising:
    a substrate comprising a display area including a plurality of pixels, and a bending region which is adjacent to the display area;
    a polarization layer in the display area and covering the plurality of pixels; and
    in the bending region:
        an anti-delamination protrusion structure having an outer surface in an inverted taper shape;
        the outer surface in the inverted taper shape defined by an upper surface and side surfaces of the anti-delamination protrusion structure; and
        a bending protective layer on the anti-delamination protrusion structure and in contact with the upper surface and the side surfaces of the outer surface of the anti-delamination protrusion structure, wherein the bending protective layer is in contact with the polarization layer.

12. The display device of claim 11, wherein the anti-delamination protrusion structure comprises an organic protrusion and a bending inorganic layer which is on the organic protrusion.

13. The display device of claim 12, wherein
    the organic protrusion includes side surfaces extended normal with respect to the substrate or extended inclined with respect to the substrate, and
    the bending inorganic layer extends along the side surfaces of the organic protrusion to have an inverted taper inclination.

14. A method of providing a display device, the method comprising:
- providing a substrate comprising a display area, and a bending region which is adjacent to the display area;
- providing a pixel partition wall layer on the substrate, in the display area, the pixel partition wall layer comprising a pixel-defining layer and a spacer which is on the pixel-defining layer; and
- providing in the bending region:
  - a first bending protective layer on the substrate and comprising a protrusion pattern; and
  - a bending inorganic layer on the protrusion pattern of the first bending protective layer, the bending inorganic layer having an inverted taper shape with respect to the substrate,
- wherein the providing of the pixel-defining layer and the spacer of the pixel partition wall layer, and the providing of the protrusion pattern of the first bending protective layer, are simultaneous.

15. The method of claim 14, wherein the providing of the bending inorganic layer on the protrusion pattern comprises providing the inverted taper shape by chemical vapor deposition.

16. The method of claim 14, wherein
- the protrusion pattern of the first bending protective layer comprises a plurality of protrusions, and
- each of the protrusions among the plurality of protrusions has a side surface which is a vertical with respect to the substrate or inclined with respect to the substrate.

17. The method of claim 14, further comprising, providing in the bending region, a second bending protective layer facing the first bending protective layer with the bending inorganic layer therebetween.

18. The method of claim 14, wherein
- each of the protrusion pattern in the bending region, and the spacer in the display area, has a height taken from the substrate, and
- the height of the protrusion pattern is equal to the height of the spacer.

* * * * *